(12) United States Patent
Nagashima et al.

(10) Patent No.: US 8,541,830 B1
(45) Date of Patent: Sep. 24, 2013

(54) NONVOLATILE SEMICONDUCTOR MEMORY DEVICE AND METHOD FOR MANUFACTURING THE SAME

(75) Inventors: Satoshi Nagashima, Yokkaichi (JP); Fumitaka Arai, Yokkaichi (JP); Hisataka Meguro, Yokkaichi (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/601,468

(22) Filed: Aug. 31, 2012

(30) Foreign Application Priority Data

Sep. 22, 2011 (JP) ................ P2011-208207

(51) Int. Cl.
*H01L 29/788* (2006.01)
*H01L 21/336* (2006.01)
*G11C 11/34* (2006.01)

(52) U.S. Cl.
USPC .......... 257/315; 257/316; 257/E29.129; 438/257; 365/185.26

(58) Field of Classification Search
CPC ........... H01L 27/115; H01L 27/11521; H01L 21/28273; G11C 16/10
USPC ......... 257/315, 316, E29.129; 265/185.01, 265/185.05, 185, 26; 438/142, 201, 257
See application file for complete search history.

(56) References Cited

U.S. PATENT DOCUMENTS

| | | | |
|---|---|---|---|
| 6,864,550 B2 | 3/2005 | Terashima | |
| 7,071,511 B2 | 7/2006 | Sakuma et al. | |
| 7,602,028 B2 | 10/2009 | Son et al. | |
| 7,781,807 B2 | 8/2010 | Nishihara et al. | |
| 2010/0181612 A1 | 7/2010 | Kito et al. | |
| 2012/0217571 A1 | 8/2012 | Arai et al. | |

FOREIGN PATENT DOCUMENTS

| | | |
|---|---|---|
| JP | 2004-273793 | 9/2004 |
| JP | 2008-98641 | 4/2008 |
| JP | 2008-140912 | 6/2008 |
| JP | 2010-171185 | 8/2010 |
| JP | 2010-212604 | 9/2010 |
| JP | 2011-40918 | 2/2011 |

*Primary Examiner* — Nikolay Yushin
(74) *Attorney, Agent, or Firm* — Oblon, Spivak, McClelland, Maier & Neustadt, L.L.P.

(57) ABSTRACT

A nonvolatile semiconductor memory device according to an embodiment includes a plurality of cell array layers, each cell array layer including: a plurality of semiconductor layers that extends in a first direction; gate insulating layers; a plurality of floating gates arranged in the first direction; inter-gate insulating layers; and a plurality of control gates that extends in a second direction intersecting semiconductor layers, and faces the floating gates via the inter-gate insulating layers, in which, in the cell array layers adjacent each other in a stacking direction, the control gates of a lower cell array layer and the control gates of the an upper cell array layer are intersecting each other, and the floating gates within the lower cell array layer and the semiconductor layers within the upper cell array layer are aligned in position with each other.

20 Claims, 35 Drawing Sheets

AA DIRECTION

GC DIRECTION

GC DIRECTION

FIG. 17A
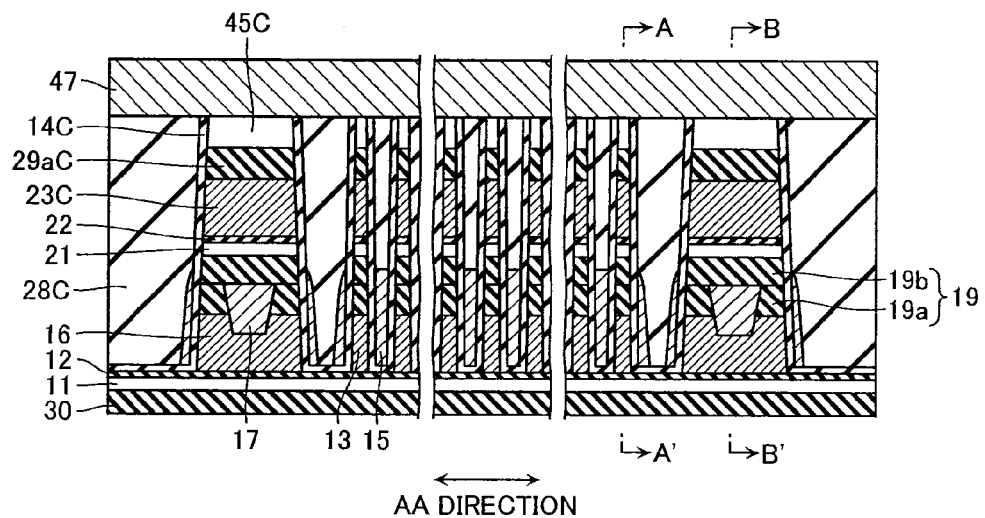
AA DIRECTION
FIG. 17B
FIG. 17C
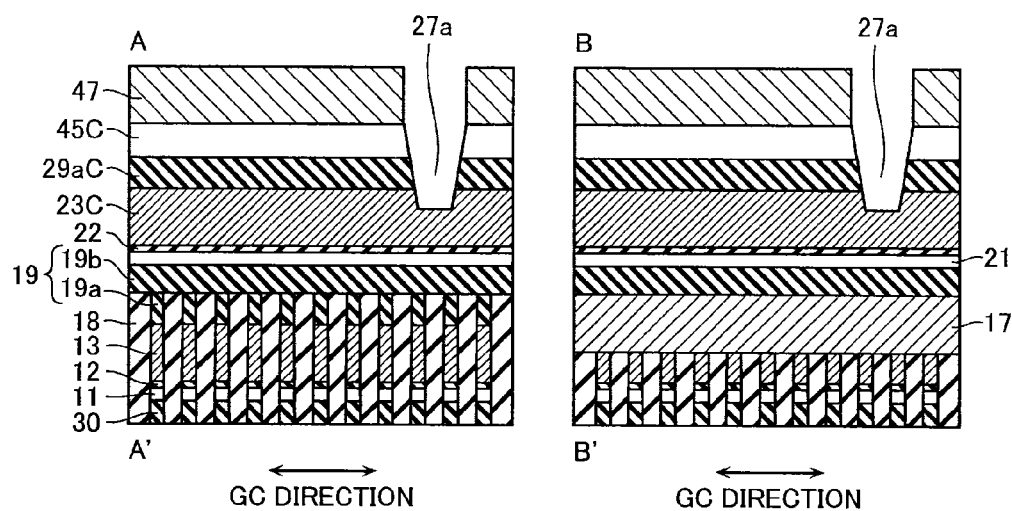
GC DIRECTION
GC DIRECTION FIG. 18A
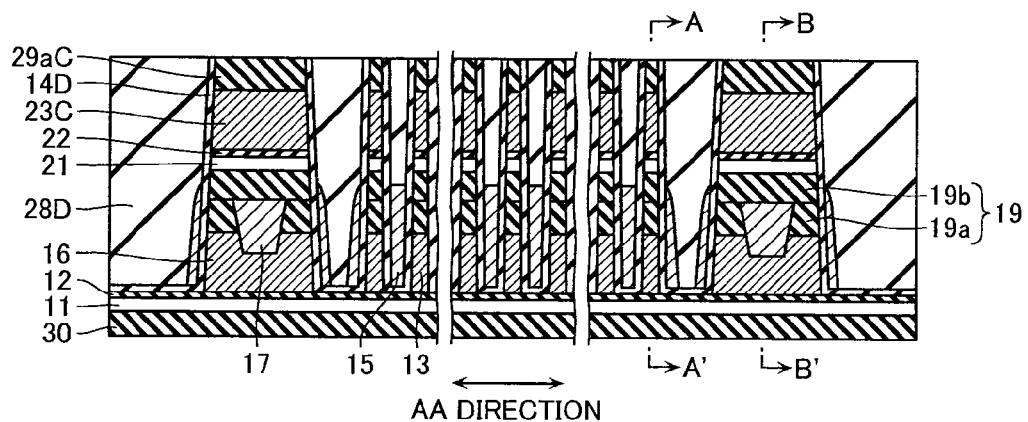
FIG. 18B
FIG. 18C
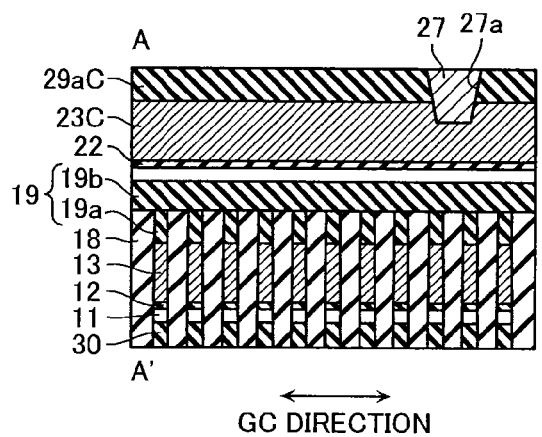
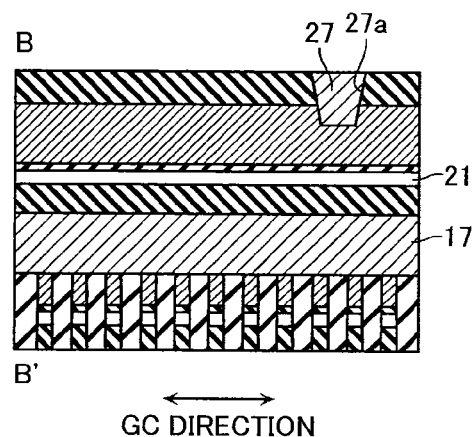

FIG. 20A
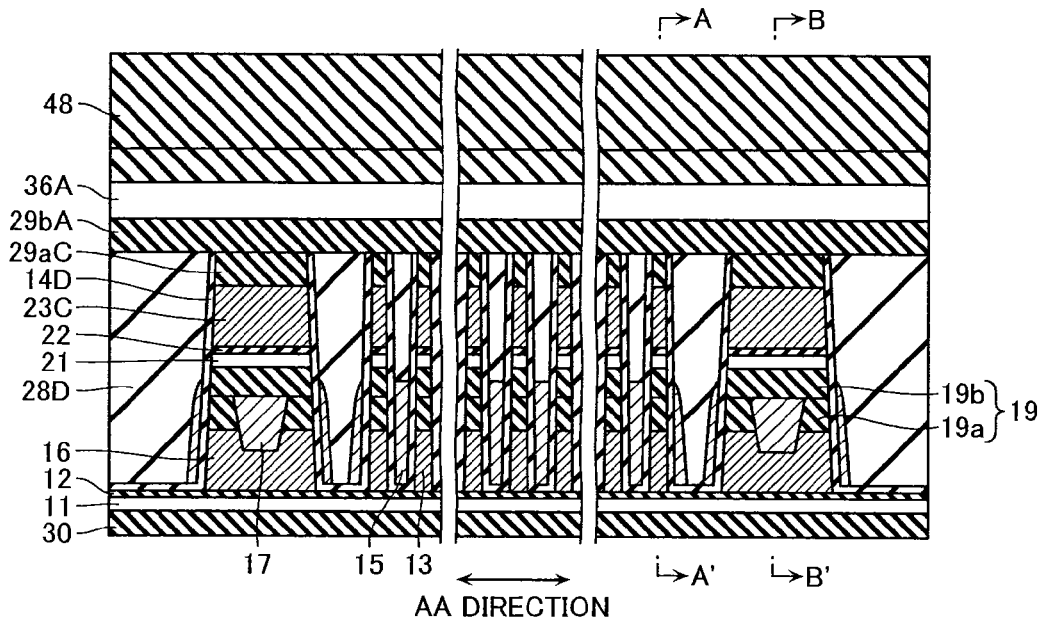
FIG. 20B
FIG. 20C
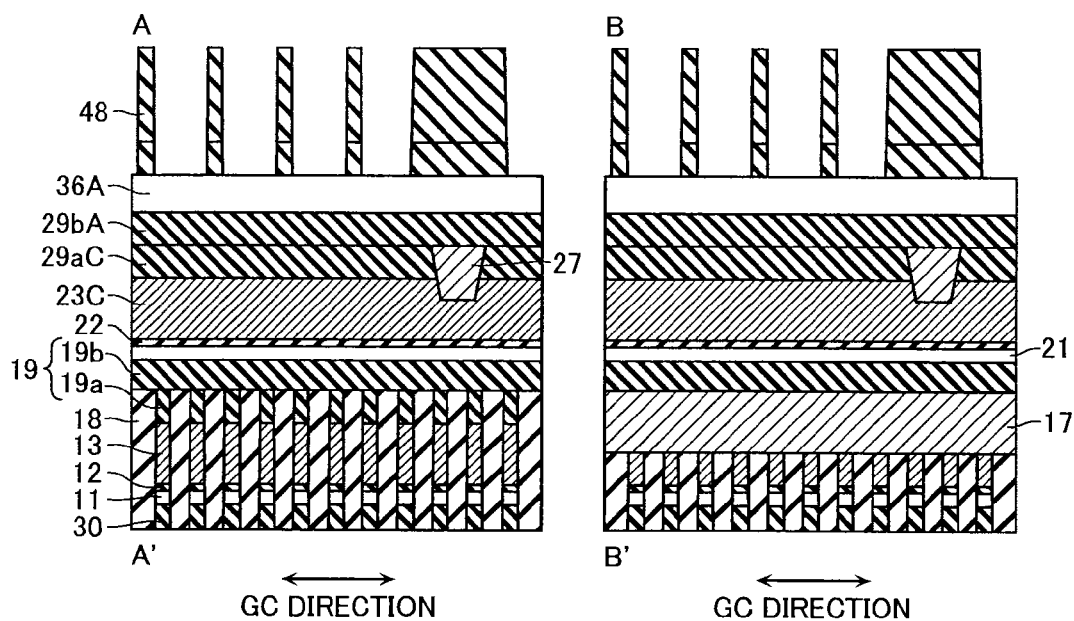

AA DIRECTION

GC DIRECTION

GC DIRECTION

FIG. 22A
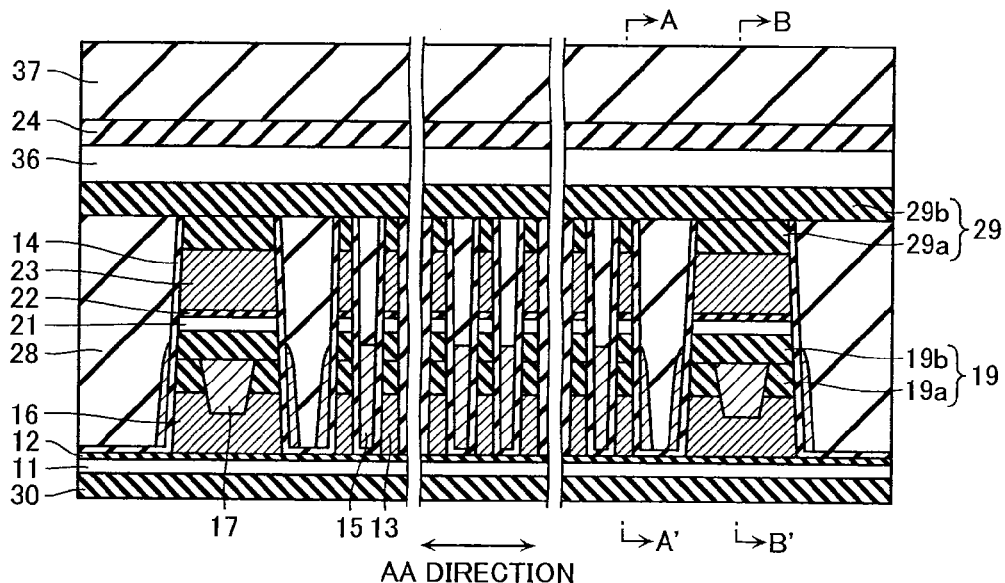
AA DIRECTION
FIG. 22B
FIG. 22C
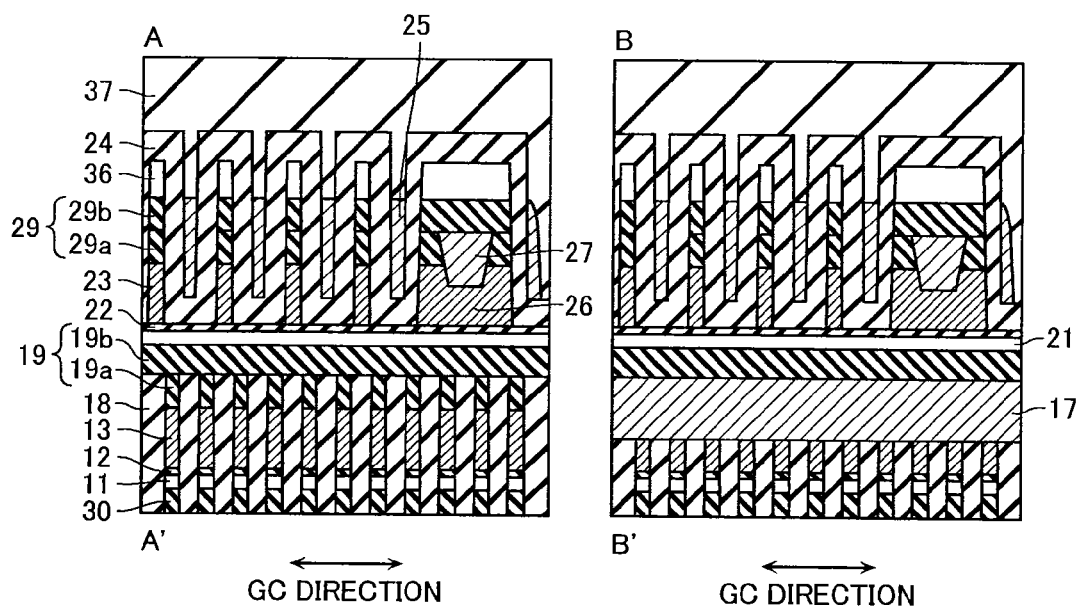
GC DIRECTION
GC DIRECTION FIG. 23A
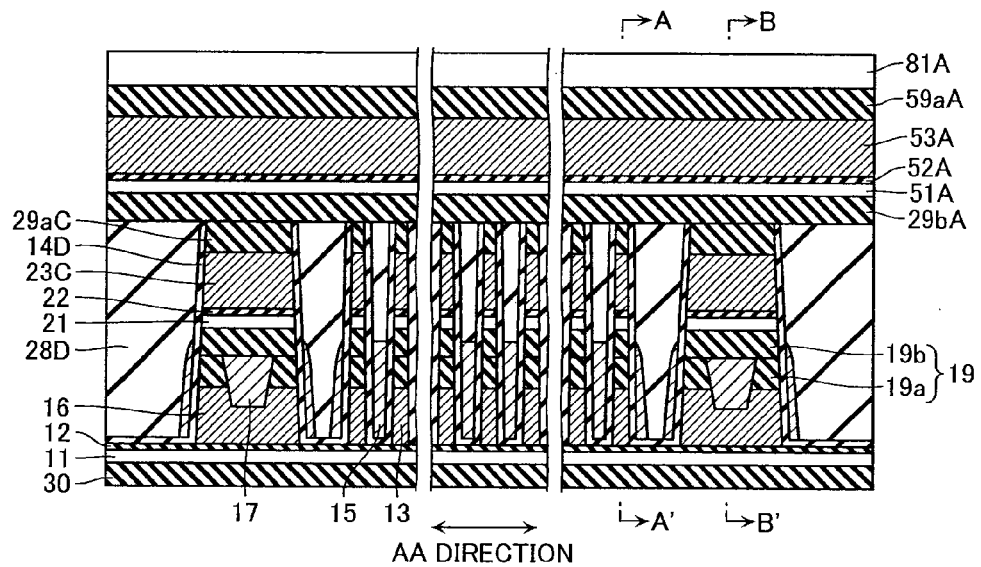
FIG. 23B
FIG. 23C
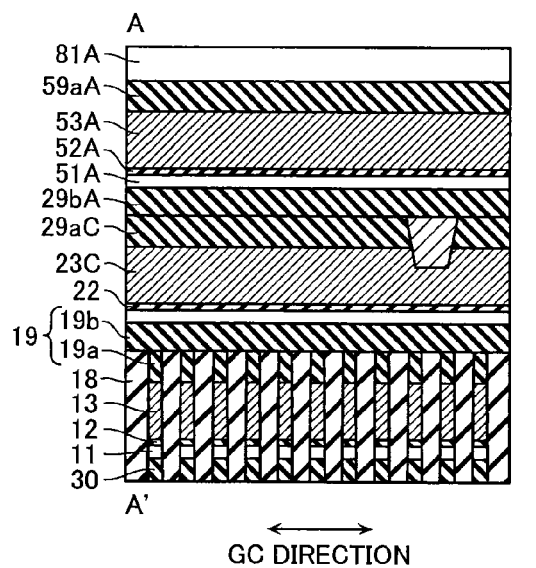
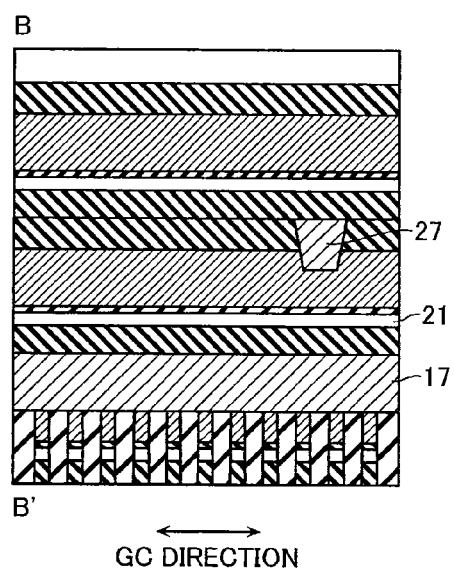

FIG. 25A
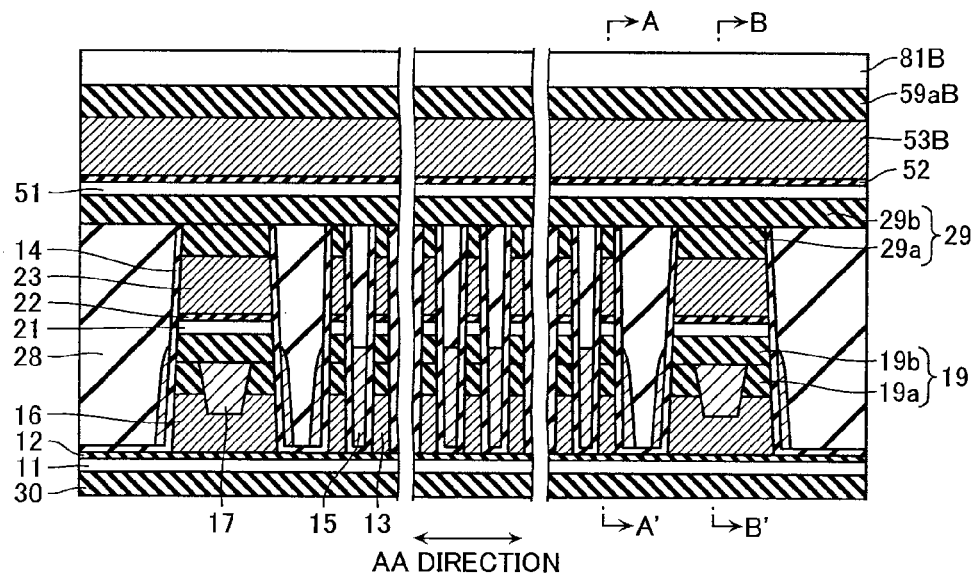
FIG. 25B
FIG. 25C
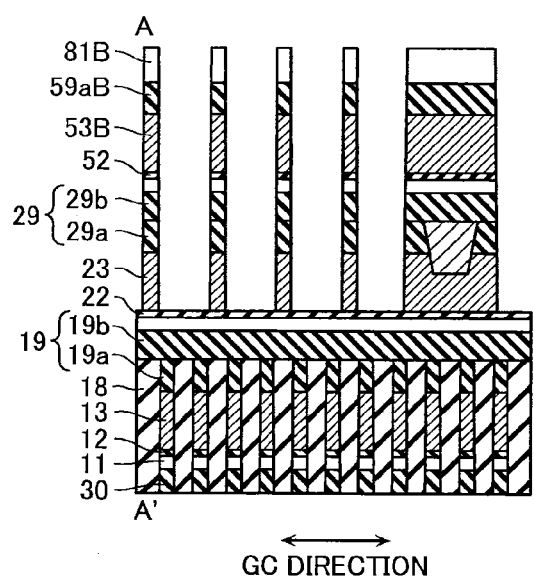
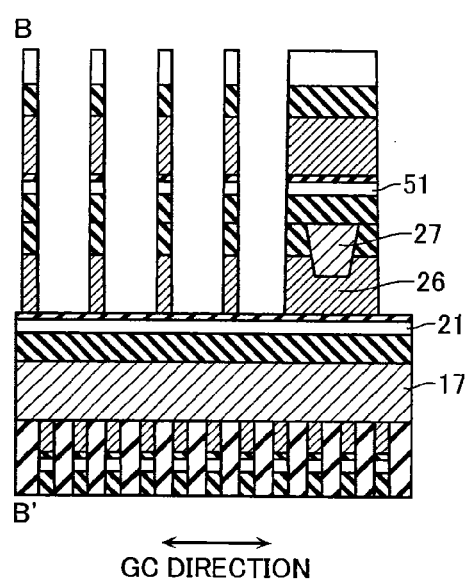

AA DIRECTION

GC DIRECTION

GC DIRECTION

AA DIRECTION

GC DIRECTION

GC DIRECTION

AA DIRECTION

GC DIRECTION

GC DIRECTION

NONVOLATILE SEMICONDUCTOR MEMORY DEVICE AND METHOD FOR MANUFACTURING THE SAME

CROSS-REFERENCE TO RELATED APPLICATIONS

This application is based upon and claims the benefit of priority from the prior Japanese Patent Application No. 2011-208207, filed on Sep. 22, 2011, the entire contents of which are incorporated herein by reference.

BACKGROUND

1. Field

Embodiments described herein relate generally to a nonvolatile semiconductor memory device and a method for manufacturing the same.

2. Description of the Related Art

NAND type flash memories are known as electrically rewritable and highly integrable nonvolatile semiconductor memory devices. Memory transistors of conventional NAND type flash memories have a stacked-gate structure in which a charge accumulation layer (floating gate) and a control gate are stacked via an insulation film. A NAND cell unit is configured by a plurality of memory transistors connected in series in a column direction with adjoining ones sharing their source or drain, and select gate transistors provided at the ends of the column of memory transistors. One end of the NAND cell unit is connected to a bit line, and the other end thereof is connected to a source line. A memory cell array is configured by NAND cell units being arranged in a matrix. NAND cell units arranged in a row direction are referred to as a NAND cell block. The gates of select gate transistors arranged in the same row are connected to the same select gate line, and the control gates of memory transistors arranged in the same row constitute a word line. When N memory transistors are connected in series in a NAND cell unit, the number of word lines included in one NAND cell block is N.

In the aforementioned NAND type flash memories, miniaturization of the NAND type flash memories has reduced the gate length and the interval between adjoining transistors, which has brought about various problems described below. For example, these problems are (a) reduction in drain current controllability based on an electric field of the control gate due to increase in parasitic capacitance between adjoining gates, etc., short channel effect (SCE), and so on, (b) increase in an interference effect between adjoining gates, (c) increase in a leak current between adjoining electrodes, (d) leaning or collapsing of patterns during fabrication of the gates because of an increasing aspect ratio of the gate electrodes, (e) deterioration of data retention characteristics due to a significant reduction in the number of electrons that can be accumulated in the charge accumulation layer (the number of electrons per bit), and so on. Hence, conventional NAND type flash memories have almost reached the physical limit of miniaturization, with a significantly narrowed writing/erasing window of the memory cells.

"Three-dimensionally stacked" memories, in which memory cell transistors are stacked sterically to form many layers, are considered to be the main method for future integration. Specifically, a structure in which nitride film trap type (SONGS, MONOS) cells are stacked is proposed in many papers, and so on. The nitride film trap type cell structure has a merit in that it can be manufactured (stacked) easily, but its major problem is that its erasing characteristic and data retention characteristic are poorer than those of the floating gate type cell because of its nature of trapping electrons in the nitride film.

On the other hand, the conventional floating gate type memory cell structure for accumulating charges in the floating gate electrode is difficult to manufacture and stack, because it has an EB (Etch Back) structure in which a control gate electrode and an IPD film (Inter-Poly-Dielectric film or inter-gate insulating film) are provided not only over the upper surface of the floating gate electrode but also over the side surfaces thereof for securing a drive power (coupling ratio) of the control gate electrode. Further, according to one method for increasing the coupling ratio in order to widen the writing/erasing window of the memory cells, it is necessary to increase the thickness of the floating gate electrode. However, if the thickness of the floating gate electrode is increased in the EB structure in which the IPD film and the control gate electrode are stacked above the floating gate electrode, the word line is consequently raised upward and the aspect ratio is increased, exposing the problem (d) described above. Therefore, it is not easy to improve the coupling ratio.

Hence, as a cell structure for securing coupling ratio without extreme difficulty of manufacture, other than the stacked gate structure, the following structure has already been proposed. That is, in this structure, each control gate electrode is embedded between floating gates via an inter-gate insulating film such that the control gate electrode extends along the word line direction. This structure secures the coupling ratio by raising the potential of a write target cell through the control gate electrodes on both sides of the target cell.

However, as for these memory cells, simply stacking them means a simple increase in the number of manufacturing steps, and it is hence difficult to reduce the bit cost while ensuring an increase in the cell capacity that is balanced with the cost increase. Simple stacking is effective only by a bit cost shrink ratio=1/the number of stacked layers, i.e., the division by the number of layers, which means that the shrink ratio is small when the number of layers is large, leading to a high bit cost. Therefore, in the cell structure seeking a shrink by stacking, an object from a practical standpoint is to restrict the number of steps and the cost.

BRIEF DESCRIPTION OF THE DRAWINGS

FIGS. 17A to 17C are cross-sectional diagrams that illustrate a portion of steps of manufacturing the memory cell array of the semiconductor memory device according to the same embodiment;

FIGS. 18A to 18C are cross-sectional diagrams that illustrate a portion of steps of manufacturing the memory cell array of the semiconductor memory device according to the same embodiment;

FIGS. 20A to 20C are cross-sectional diagrams that illustrate a portion of steps of manufacturing the memory cell array of the semiconductor memory device according to the same embodiment;

FIGS. 22A to 22C are cross-sectional diagrams that illustrate a portion of steps of manufacturing the memory cell array of the semiconductor memory device according to the same embodiment;

FIGS. 23A to 23C are cross-sectional diagrams that illustrate a portion of steps of manufacturing a memory cell array of a semiconductor memory device according a second embodiment;

FIGS. 25A to 25C are cross-sectional diagrams that illustrate a portion of steps of manufacturing the memory cell array of the semiconductor memory device according to the same embodiment;

DETAILED DESCRIPTION

Figure 1:
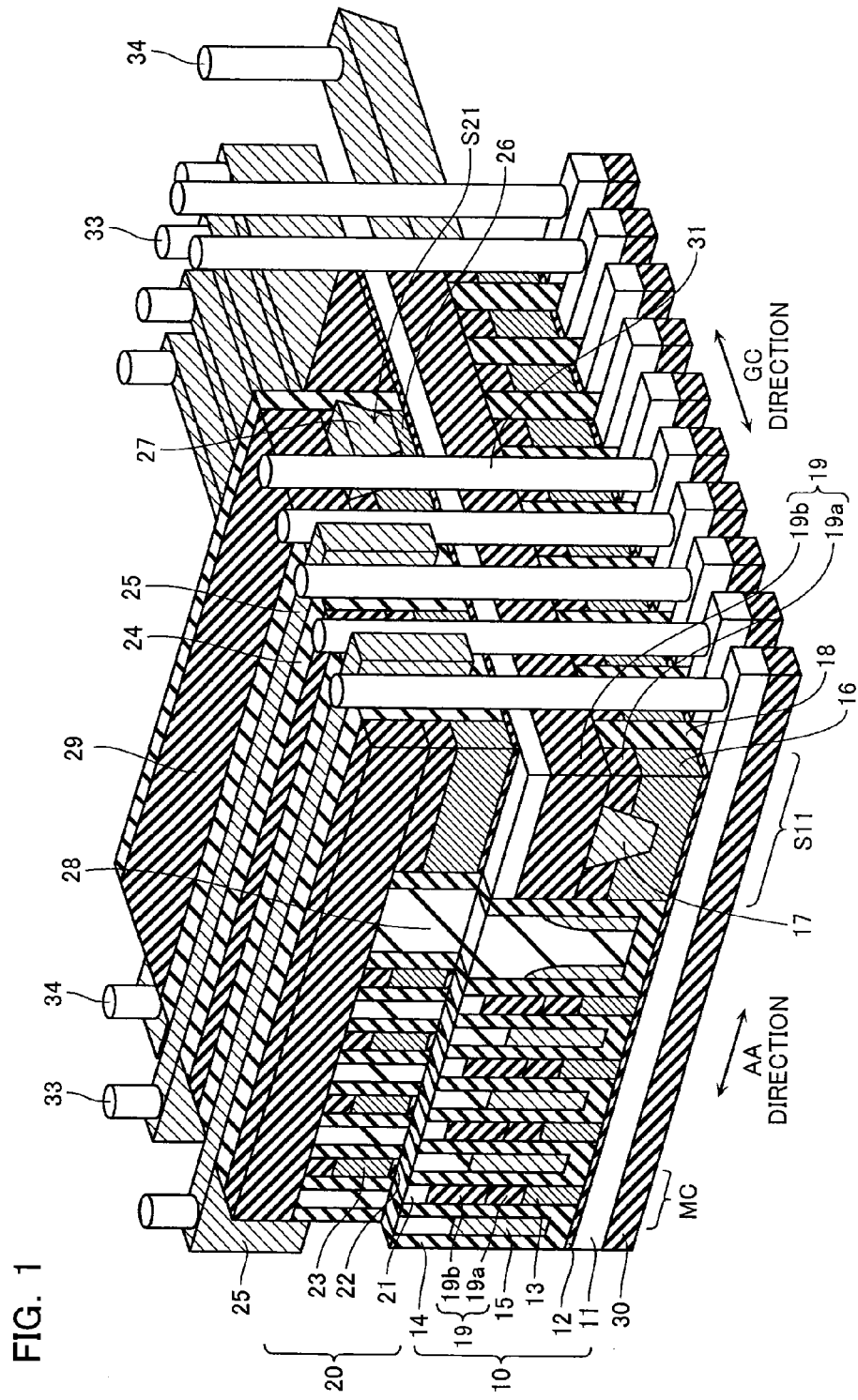
FIG. 1 is a perspective view of a portion of a memory cell array of a semiconductor memory device according to a first embodiment.

A nonvolatile semiconductor memory device according to an embodiment includes a plurality of memory cell array layers being stacked, each memory cell array layer including: a plurality of semiconductor layers each extending in a first direction and being in parallel to each other; gate insulating layers formed on the semiconductor layers; a plurality of floating gates formed on the gate insulating layers and arranged in the first; inter-gate insulating layers adjacent to the floating gates; and a plurality of control gates that face the floating gates via the inter-gate insulating layers on both sides of the floating gates in the first direction and that extend in a second direction intersecting the first direction in the cell array layers adjacent to each other in a stacking direction, the control gates of the cell array layer as a lower cell array layer and the control gates of the cell array layer as an upper cell array layer intersecting each other, the floating gates in the lower cell array layer and the semiconductor layers on the floating gates being aligned in position with each other.

Hereafter, embodiments of a nonvolatile semiconductor memory device and a method of manufacturing the same according to the invention are described referring to the drawings.

[Basic Memory Cell Array Structure]

Before a first embodiment will be explained, a memory cell structure of a NAND type flash memory which forms the basis of the nonvolatile semiconductor memory device according to a first embodiment will be explained.

As a cell structure for securing coupling between a floating gate (charge accumulation layer) and a control gate, the present embodiment does not have the stacked-gate structure but a gate structure in which control gates are embedded at both sides of a floating gate to let the floating gate couple with the control gates on both sides thereof.

Figure 38:
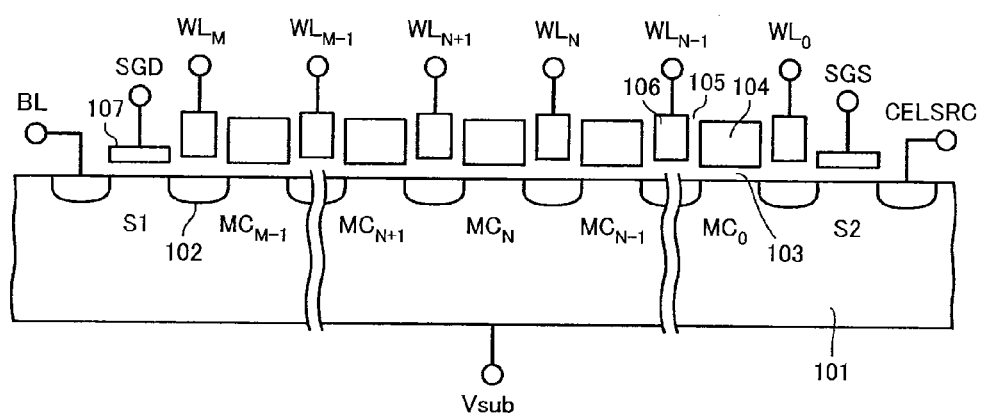
FIG. 38 is a diagram that illustrates the structure of a memory cell array of a NAND type flash memory that constitutes a basic configuration of the same embodiment.
Figure 39:
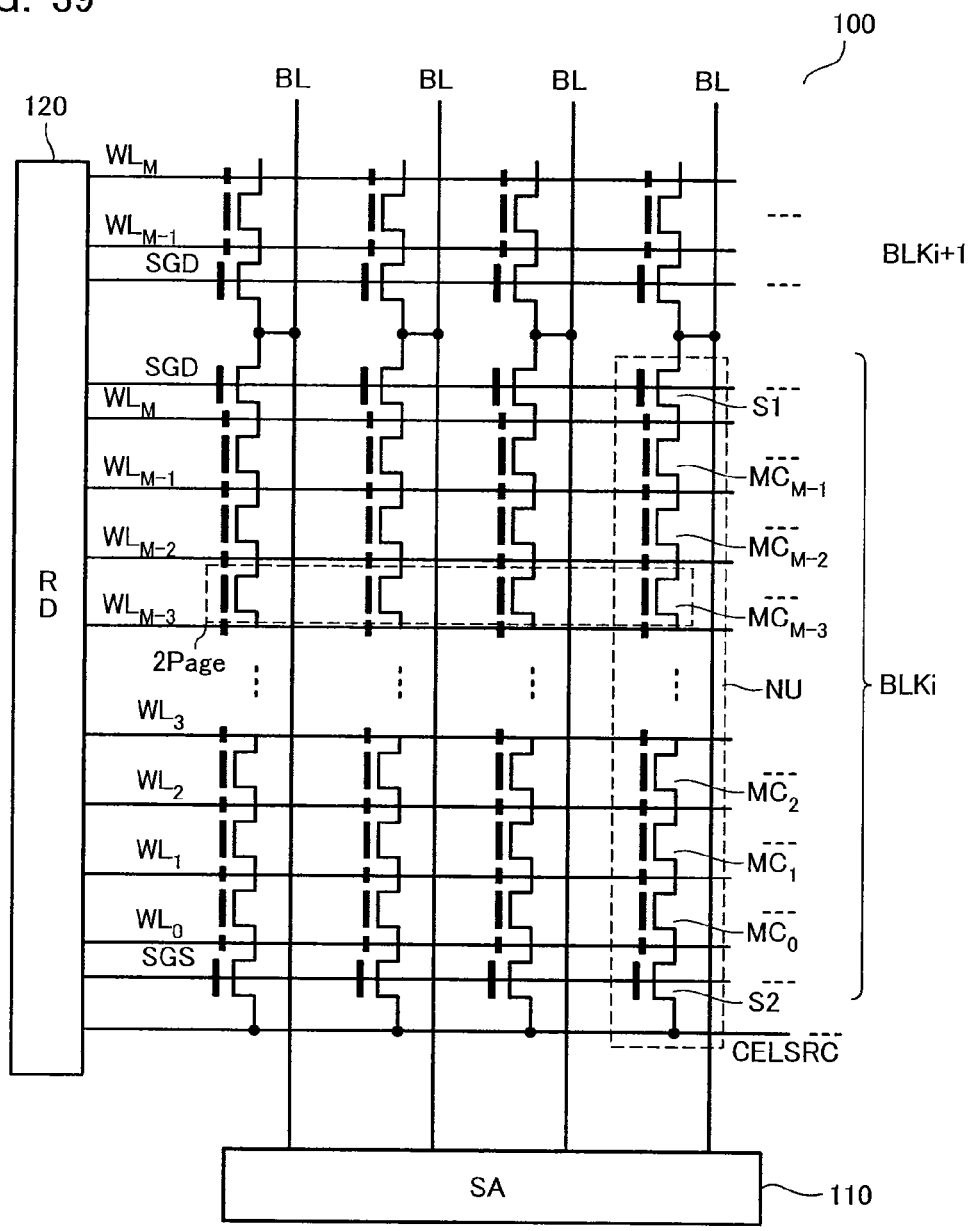
FIG. 39 is a circuit diagram of the memory cell array of the NAND type flash memory that constitutes a basic configuration of the same embodiment.

FIG. 38 is a diagram illustrating the structure of a memory cell array 100 of a NAND type flash memory that adopts the structure. FIG. 39 is a circuit diagram of the memory cell array 100.

A memory cell array 100 includes a plurality of NAND cell units NU each including: a NAND string configured by M number of electrically-rewritable nonvolatile memory cells MC0 to MCM-1 connected in series; and select gate transistors S1 and S2 connected to both ends of the NAND string. One end of the NAND cell unit NU (that is on the select gate transistor S1 side) is connected to a bit line BL, and the other end thereof (that is on the select gate transistor S2 side) is connected to a common source line CELSRC. The gate electrodes of the select gate transistors S1 and S2 are connected to select gate lines SGD and SGS. The control gate electrodes provided on both sides of the memory cells MC0 to MCM-1 are connected to word lines WL0 to WLM respectively. The bit lines BL are connected to a sense amplifier circuit 110, and the word lines WL0 to WLM and the select gate lines SGD and SGS are connected to a row decoder circuit 120.

n-type diffusion layers 102 to function as sources and drains of MOSFETs constituting the memory cells MC are formed in a p-type well 101 formed in a substrate. Moreover, floating gates (FG) 104 are formed on a well 101 via a gate insulating layer 103 to function as a tunnel insulating layer, and control gates (CG) 106 are formed at both sides of the floating gates 104 via an inter-gate insulating layer (IPD) 105. The control gates 106 constitute the word lines WL. The select gate transistors S1 and S2 have select gates 107 on the well 101 via the gate insulating film 103. The select gates 107 constitute the select gate lines SGS and SGD. The memory cells MC and the select gate transistors S1 and S2 are connected in series such that adjoining ones share their drains and sources.

In a case of 1 bit/cell where data of 1 bit is stored in one memory cell MC, data of 1 page is stored in the memory cells MC formed along a pair of word lines WL perpendicular to a NAND cell unit NU. In a case of 2 bits/cell where data of 2 bits are stored in one memory cell MC, data of 2 pages (an upper page UPPER and a lower page LOWER) is stored in the memory cells MC formed along a pair of word lines WL.

One block BLK includes a plurality of NAND cell units NU that share word lines WL. One block BLK forms a unit of data erasing operation. In one memory cell array 1, the number of word lines WL for one block BLK is M+1, and the number of pages for one block is M=64, which becomes M×2=128 pages in the case of 2 bits/cell.

In writing data into a write target memory cell MC, the control gates 106 at both sides of the floating gate 104 of the write target memory cell MC are set to a predetermined writing voltage while the other control gates 106 are set to voltage values that decrease gradually in an oscillating manner from the predetermined writing voltage forward a predetermined pass voltage as a distance from the write target memory cell MC increases to prevent non-selected memory cells from being written erroneously (See also U.S. Pat. No. 7,020,025 B2).

[Memory Cell Array Structure according to First Embodiment]

Figure 2:
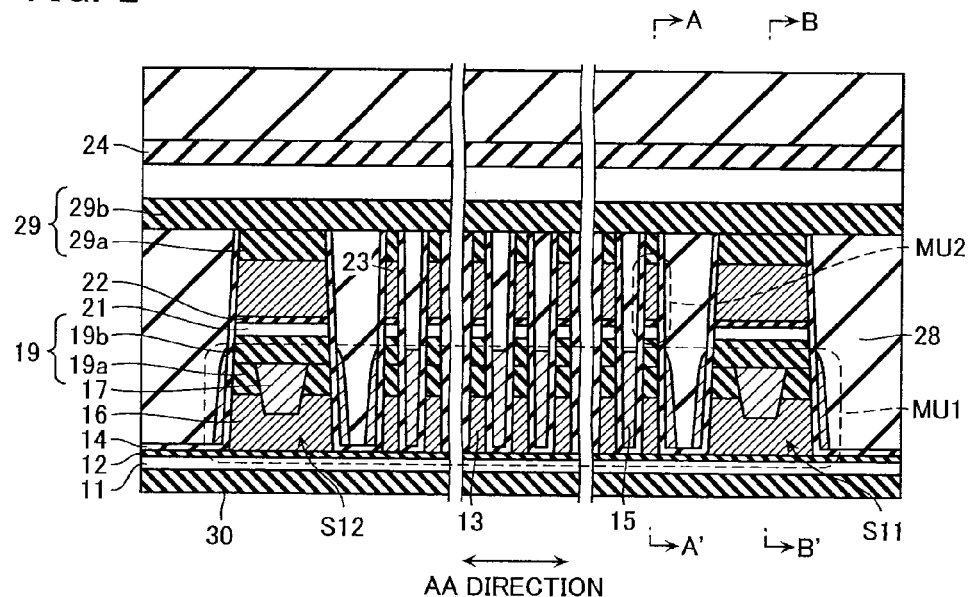
FIG. 2 is a cross-sectional diagram seen from the GC (gate) direction of FIG. 1.
Figure 3A:
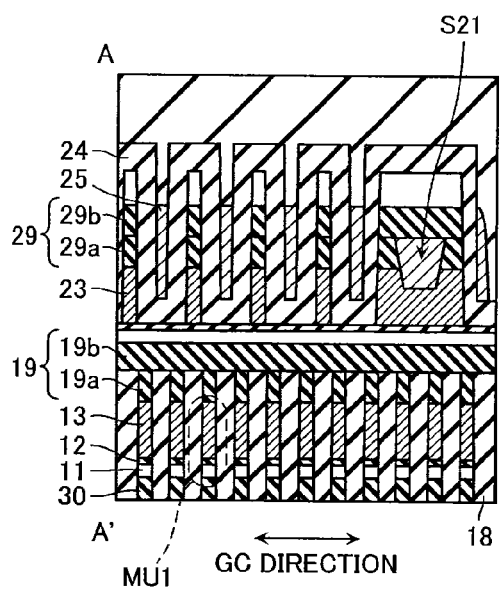
FIGS. 3A and 3B are cross-sectional diagrams cut along line A-A' and line B-B' of FIG. 2 and viewed from an AA (active area) direction of FIG. 1.
Figure 3B:
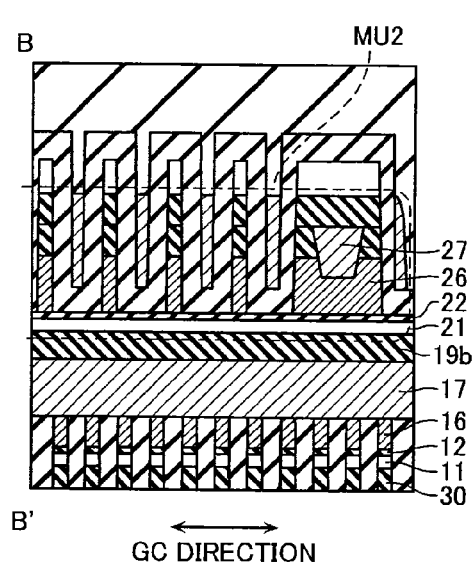

Next, the memory cell array structure according to the first embodiment will be explained. FIG. 1 is a perspective view of a memory cell array structure according to the first embodiment, FIG. 2 is a cross-sectional diagram seen from the GC (gate) direction of FIG. 1, and FIGS. 3A and 3B are cross-sectional diagrams cut along each of line A-A' and line B-B' of FIG. 2, and seen from the AA (active area) direction of FIG. 1. Note that the drawings are illustrated with some components omitted, in order to make the internal structure visible. Moreover, AA direction and GC direction are written in the drawing. The AA direction indicates a direction in which an active area (AA) in the lowermost layer extends and the GC direction indicates a direction in which a control gate in the lowermost layer extends. In addition, although a first floating gate 13 and a second floating gate 23 to be described later are illustrated on the same cross section in FIG. 2, the way of illustration on the same cross section is made merely for the convenience of the explanation. Actually, as illustrated in FIG. 1, the first floating gate 13 and the second floating gate 23 are not arranged on the same cross section.

The memory cell array structure is the one obtained a plurality of memory cell array structures illustrated in FIG. 38 was rotated by 90° in the plane parallel to the substrate, and then stacked.

That is, as illustrated in FIG. 1, a first cell array layer 10 is arranged on a plurality of insulation bases 30 extending in the AA direction and arranged in the GC direction, and a second cell array layer 20 is arranged on the first cell array layer 10 in a state of being rotated by 90° with respect to the first cell array layer 10 in the plane parallel to the substrate.

The first cell array layer 10 includes first semiconductor layers 11 which are arranged to extend along the upper surface of insulation bases 30 and which serve as a channel body extending in the AA direction, and a plurality of floating gates 13 stacked on such a structure via a first gate insulating layer 12 to serve as a tunnel insulating layer. First control gates 15 are disposed on both side surfaces of the first floating gate 13 in the AA direction via a first inter-gate insulating layer 14. A memory cell MC is configured by the first semiconductor layer 11, the first gate insulting layer 12, the first floating gate 13, the first inter-gate insulating layer 14, and the first control gates 15 provided at both sides of the first floating gate 13, and a plurality of memory cells is connected in series to each other in the AA direction.

First select gates 16 to form select gate transistors S11 and S12 are arranged at both ends, in the AA direction, of the plurality of memory cells MC connected in series to each other. The first select gates 16 face the first semiconductor layers 11 via the first gate insulating layer 12. First select gate lines 17 that extend in the GC direction are embedded in the first select gates 16.

A plurality of the memory cells MC connected in series to each other, and the select gate transistors S11 and S12 constitute a first memory unit MU1. A plurality of the first memory units MU1 is arranged in the GC direction with a first inter-layer insulating layer 18 interposed every between them. The select gate lines 17 and the first control gates 15 of the plurality of first memory units MU1 arranged in the GC direction are connected in common to each other in the GC direction.

A second semiconductor layer 21 is stacked on the first floating gate 13 via the first inter-layer insulating layer 19 such that its lengthwise direction is aligned with the lengthwise direction of the first control gate, and such that it overlaps the first control gate 13 and the first select gate 16 in the stacking direction. The second semiconductor layer 21 becomes a channel body of a memory cell to constitute a second cell array layer 20.

A second floating gate 23 is formed on the second semiconductor layer 21 via a second gate insulating layer 22 to serve as a tunnel insulating layer. Second control gates 25 are formed on both sides of the second floating gate 23 in the GC direction via a second inter-gate insulating layer 24. A memory cell MC is configured by the second semiconductor layer 21, the second gate insulting layer 22, the second floating gate 23, the second inter-gate insulating layer 24, and the second control gates 25 provided at both sides of the second floating gate 23, and a plurality of memory cells MC is connected in series to each other in the GC direction.

Second select gates 26 to form select gate transistors S21 and S22 (S22 is not illustrated) are arranged at both ends, in the GC direction, of the plurality of memory cells MC connected in series to each other like in the first memory cell array layer 10. The second select gates 26 face the second semiconductor layer 21 via the second gate insulating layer 22. Second select gate lines 27 that extend in the AA direction are embedded in the second select gates 26.

A plurality of the memory cells MC connected in series to each other, and select gate transistors S21 and S22 constitute a second memory unit MU2. A plurality of the second memory units MU2 is arranged in the AA direction with a second inter-layer insulating layer 28 interposed every between them. The select gate lines 27 and the second control gates 25 of the plurality of second memory units MU2 arranged in the AA direction are connected in common to each other in the AA direction.

A bit line electric contact 31 that extends in the stacking direction is formed on the first semiconductor layer 11 in a lower layer that extends from an end of the memory unit MU1. Similarly, another bit line electric contact 31 is formed on the second semiconductor layer 12 in an upper layer that extends from an end of the memory unit MU2. Upper ends of the bit line electric contacts 31 are respectively connected to the bit lines which are not illustrated, and a lower ends thereof are respectively connected to the first and second semiconductor layers 11 and 21. Moreover, a source line electric contact, not illustrated, that extends in the stacking direction is formed on the first semiconductor layer 11 in the lower layer that extends from the other end of the first memory unit MU1. Similarly, another source line electric contact is formed on the second semiconductor layer 21 in the upper layer that extends from the other end of the second memory unit MU2. Upper ends of the source line electric contacts are connected to source lines which are not illustrated, and lower ends thereof are respectively connected to the first and second semiconductor layers 11 and 21. In addition, an end of the word line electric contact 33 that extends in the stacking direction is connected to ends of the control gates 15 and 25, and an end of the select gate line electric contact 34 that extends in the stacking direction is connected to the ends of the select gate lines 17 and 27.

As illustrated in FIGS. 1 and 3, the first cell array layer 10 is formed to be rotated by 90° about the second cell array layer 20, and the first control gate 15 and the first select gate line 17 of the first cell array layer 10 as a lower layer are orthogonal to the second control gate 25 and the second select gate line 27 of the second cell array layer 20 as an upper layer. Moreover, the first floating gate 13 and the first select gate 16 of the first cell array layer 10 as the lower layer overlap the second semiconductor layer 21 of the second cell array layer 20 as the upper layer in the stacking direction. Therefore, a portion where the upper and lower cell array layers 10 and 20 overlap each other can be processed by a common etching process. As a result, bit cost can be reduced.

Here, according to the present embodiment, since the first cell array layer 10 and the second cell array layer 20 are formed to be rotated by 90° about each other, the bit line electric contact 31 of the lower layer runs in the direction in which the second control gate 25 of the upper layer extends, and thus they are likely to interfere with each other. Therefore, according to the present embodiment, as illustrated in FIGS. 3A and 3B, the second control gate 25 and the first semiconductor layer 11 are formed to be shifted from each other in the GC direction so that the second control gate 25 runs through between the bit line contact 31. From such a reason, it is desirable that the pitch of the second control gates 25 in the GC direction is the product of the pitch of the first semiconductor layers 11 in the GC direction multiplied by an even number.

Note that although the first cell array layer 10 and the second cell array layer 20 are formed to be rotated by 90° about each other in this embodiment, the difference in angle between the first cell array layer 10 and the second cell array layer 20 may be formed other than 90°. Therefore, the first control gate 15 and the first select gate line 17 of the first cell array layer 10 may be intersect the second control gate 25 and the second select gate line 27 of the second cell array layer 20.

Figure 4:
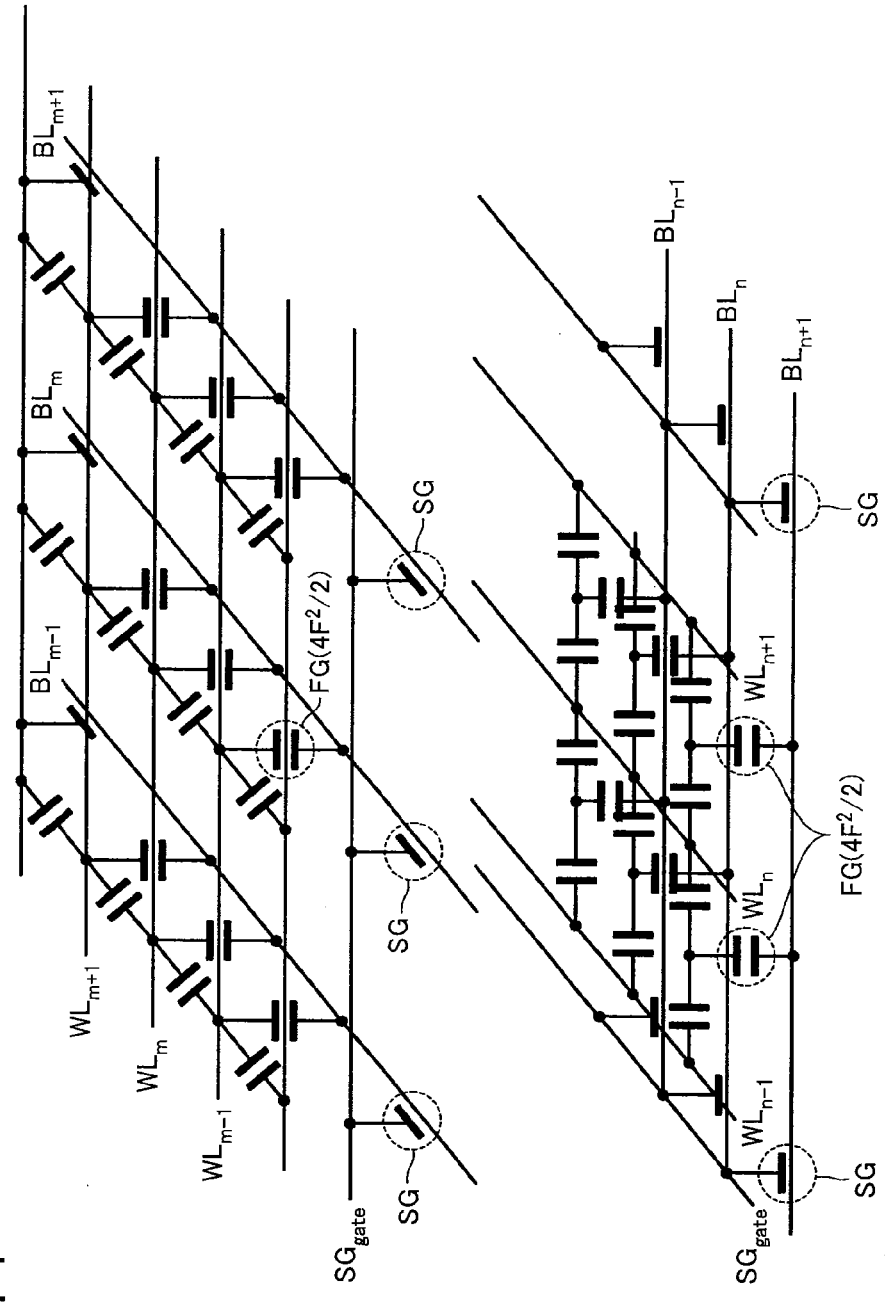
FIG. 4 is a circuit diagram of a portion of the memory cell array of the semiconductor memory device according to the same embodiment.

FIG. 4 illustrates an equivalent circuit of the memory cell array according to the present embodiment. As can be understood from the above, the present embodiment employs a method for executing writing by raising the potential of the floating gates 13 and 23 through the control gates 15 and 25 at both sides of the floating gates 13 and 23, and hence does not have such an EB (Etch Back) structure as that of the conventional floating gate type cells that are difficult to manufacture. Therefore, the present embodiment is less difficult to manufacture, and thus realizes a cell structure that is suitable for stacking. In an upper and lower cell array layers, the bit lines BL and the word lines WL extend in in-plane directions different from each other by 90° in reach of the planes.

When a higher coupling ratio is needed to widen the writing/erasing window of the memory cells MC, it is considered to increase the thickness of the floating gate. According to the present embodiment, the control gates 15 and 25 are provided on both sides of the floating gates 13 and 23 via the inter-gate insulating films 14 and 24, and the floating gate and the control gate are not provided in a stacked structure. Therefore, thickening of the floating gate is easy, and the coupling ratio can be increased while the word lines are maintained at a low aspect. This is advantageous for the problem of pattern leaning and collapsing, and so on. during fabrication of the gates. As regards the bit cost problem too, because the patterns extending in the AA direction for the upper cells and lower cells can be manufactured collectively as will be illustrated in the following manufacturing flow, it is possible to reduce the number of steps and to reduce critical lithography steps of which unit process price is high, making it possible to restrict the bit cost. Hence, the structure proposed here is advantageous for the various problems of stacking.

[Method for Manufacturing Memory Cell Array Structure According to First Embodiment]

Next, a method for manufacturing the memory cell array according to the present embodiment will be explained.

First, there are some conceivable variations regarding the formation of a peripheral circuit region. When the formation is on a bulk silicon substrate, it is necessary to form the peripheral circuits first. At this time, it is also possible to simultaneously form the memory cell arrays according to the present embodiment on the bulk silicon substrate. In the present embodiment, the NAND cell units NU1 and NU2 are provided sterically. Hence, an example of forming NAND cell units NU1 and NU2 above a silicon substrate will be explained. The method for forming peripheral circuit transistors is the same as an ordinary method. That is, the channel forming is performed on the silicon substrate first, and then the gate oxide layers (both of the Low Voltage Oxide Layer and the High Voltage Oxide Layer) are formed. In addition, the gate electrode and the AA (active area) processing mask material are deposited. After that, an STI trench is formed. Then, after the STI trench is filled, a mask material for the formation of GC (gate) is stacked, GC electrodes are processed, and a side wall insulating layer is formed. After this, a source/drain diffusion layer is formed, an inter-GC insulating layer is embedded, and the surface is planarized.

After the peripheral circuits are formed, the memory cell array according to the present embodiment is formed as their overlying layer. FIGS. 5A to 22C are diagrams illustrating the method for manufacturing the memory cell array according to the present embodiment.

Figure 5A:
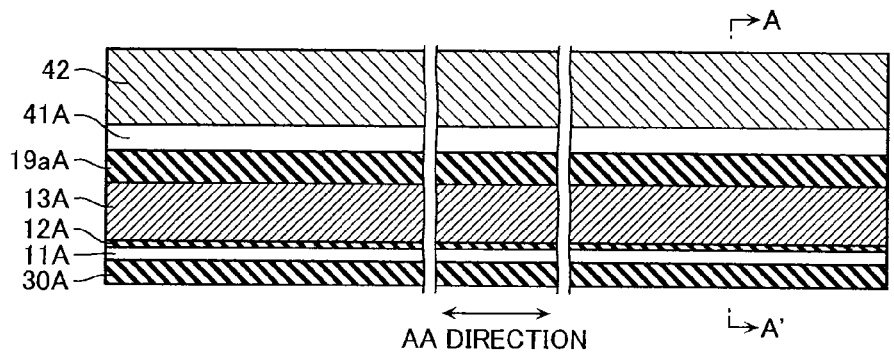
FIGS. 5A and 5B are cross-sectional diagrams that illustrate a portion of steps of manufacturing the memory cell array of the semiconductor memory device according to the same embodiment.
Figure 5B:
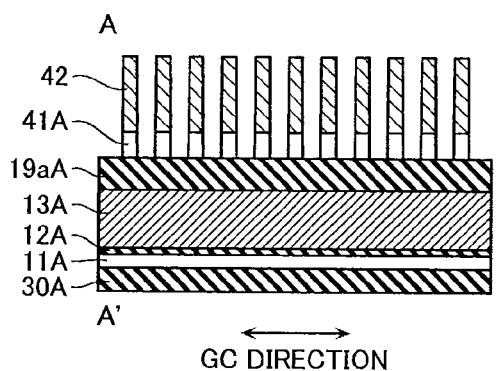

As illustrated in FIGS. 5A and 5B, an insulating layer 30A made of $SiO_2$ is first formed on a silicon substrate not illustrated in the drawing. Then, the followings are sequentially stacked on the resultant structure: a semiconductor layer 11A made of polysilicon; a first gate insulating layer 12A made of $SiO_2$; a first floating gate forming layer 13A made of polysilicon; an insulating layer 19aA; a nitride layer 41A; and a mask material 42. The first semiconductor layer 11A to become a channel (body) is basically made of polysilicon, but may be made of monocrystal silicon. In the present embodiment, by using polysilicon for the channel (body) so as to form an SOI structure, it becomes unnecessary to form an STI in the silicon substrate, which realizes a cell structure that is more suitable for stacking. Since the formation of the first gate insulating layer 12A is performed on the semiconductor layer 11A made of polysilicon, it may not be a thermal oxidation layer but be a CVD (Chemical Vapor Deposition) oxidation layer or an ALD (Atomic Layer Deposition) oxidation layer. Note that although the first semiconductor layer 11A is provided by film formation as described above, it may instead be a silicon substrate as it is. Moreover, SiN or the like may be used as the material of the nitride layer 41A, and SiN, $SiO_2$, or the like may be used as the material of the mask material 42.

Figure 6A:
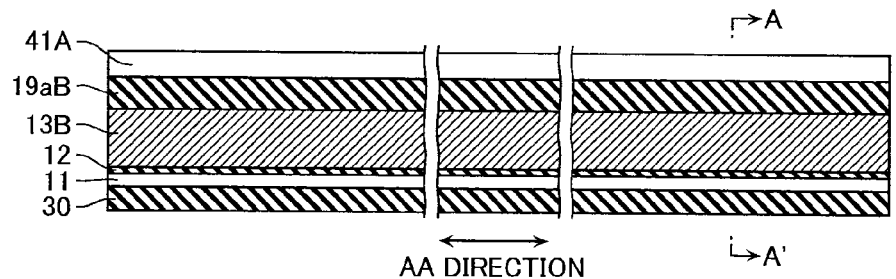
FIGS. 6A and 6B are cross-sectional diagrams that illustrate a portion of steps of manufacturing of the memory cell array of the semiconductor memory device according to the same embodiment.
Figure 6B:
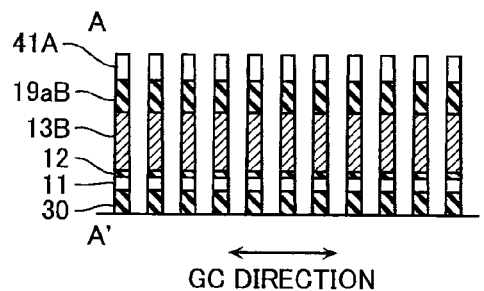

Next, as illustrated in FIGS. 6A and 6B, the stacked body is selectively etched up to the bottom of the insulating 30A by RIE (Reactive Ion Etching) that uses the nitride layer 41A and the mask material 42 to thereby process an AA pattern and remove the mask material 42. As a result, an insulating layer 19aB, a floating gate forming layer 13B, the first gate insulating layer 12, the semiconductor layer 11, and the insulating layer 30 are formed. The etching may be performed in a single stage or divided into two or more stages.

Figure 7A:
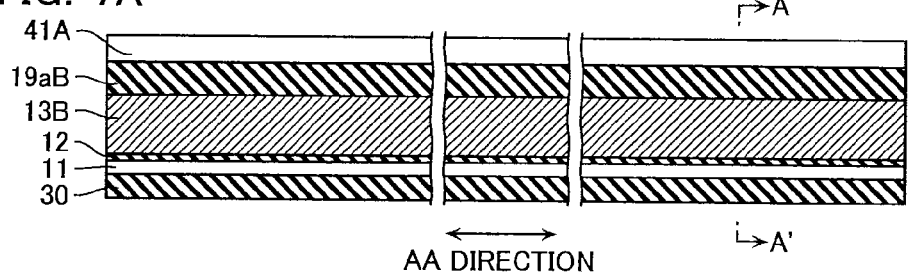
FIGS. 7A and 7B are cross-sectional diagrams that illustrate a portion of steps of manufacturing the memory cell array of the semiconductor memory device according to the same embodiment.
Figure 7B:
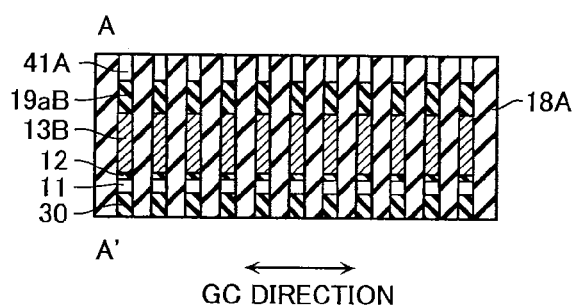
Figure 8A:
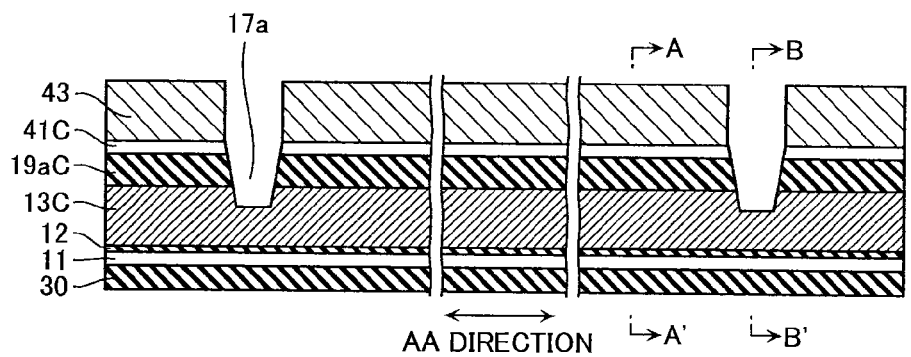
FIGS. 8A to 8C are cross-sectional diagrams that illustrate a portion of steps of manufacturing the memory cell array of the semiconductor memory device according to the same embodiment.
Figure 8B:
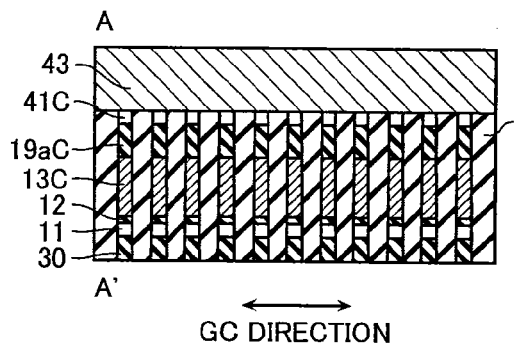
Figure 8C:
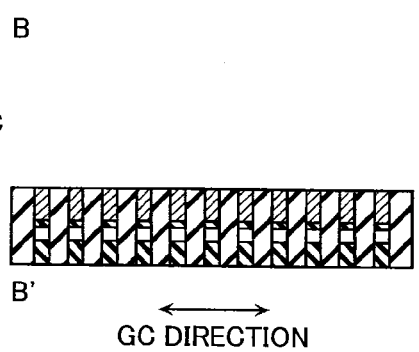

Next, as illustrated in FIGS. 7A and 7B, the trench formed by the AA pattern processing is filled with an inter-layer insulating layer 18A made of $SiO_2$, and a planarization process using the CMP (Chemical Mechanical Polishing) technique is preformed over the entire surface of the stacked body. Next, as illustrated in FIGS. 8A to 8C, a trench forming pattern for formation of the first select gate line 17, such as the mask material 43 made of, for example, SiN or $SiO_2$, is formed on the inter-layer insulating layer 18A and the nitride layer 41A. Next, the stacked body is selectively etched by the RIE using the mask material 43 until the floating gate forming layer 13B is exposed, so that a trench 17a for formation of the first select gate line extending in the GC direction is formed as illustrated in FIGS. 8A to 8C. As a result, the floating gate forming layer 13C with the trench 17a formed therein, the insulating layers 18C and 19aC, and the nitride layer 41C are formed.

Figure 9A:
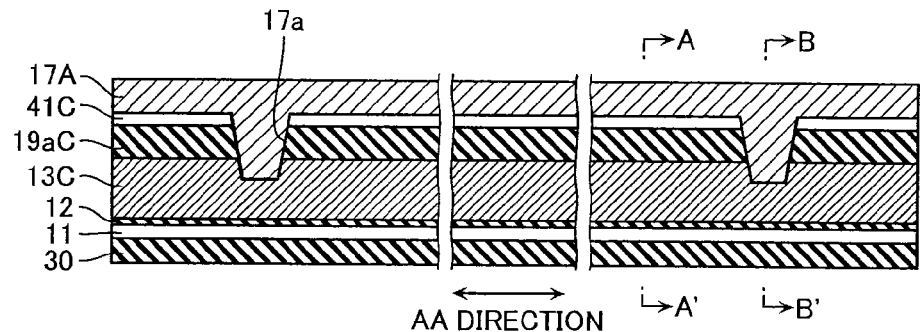
FIGS. 9A to 9C are cross-sectional diagrams that illustrate a portion of steps of manufacturing the memory cell array of the semiconductor memory device according to the same embodiment.
Figure 9B:
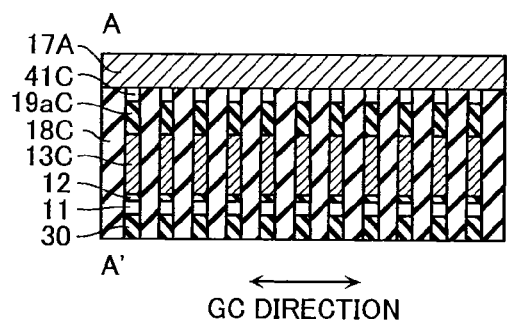
Figure 9C:
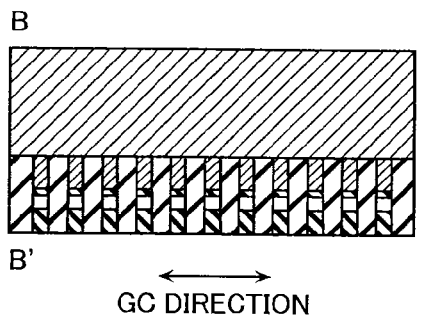
Figure 10A:
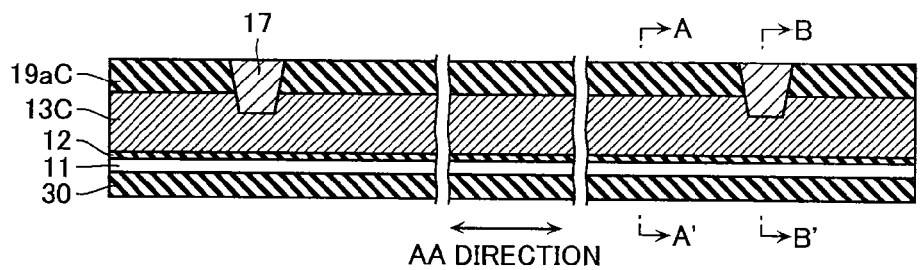
FIGS. 10A to 10C are cross-sectional diagrams that illustrate a portion of steps of manufacturing the memory cell array of the semiconductor memory device according to the same embodiment.
Figure 10B:
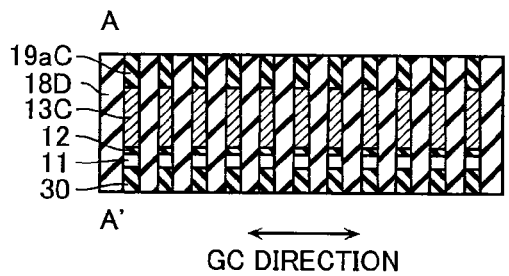
Figure 10C:
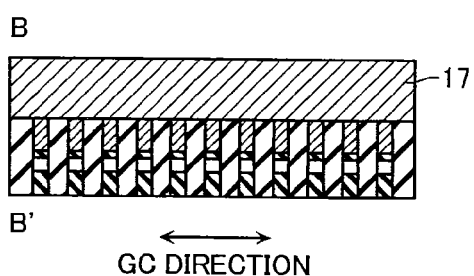
Figure 11A:
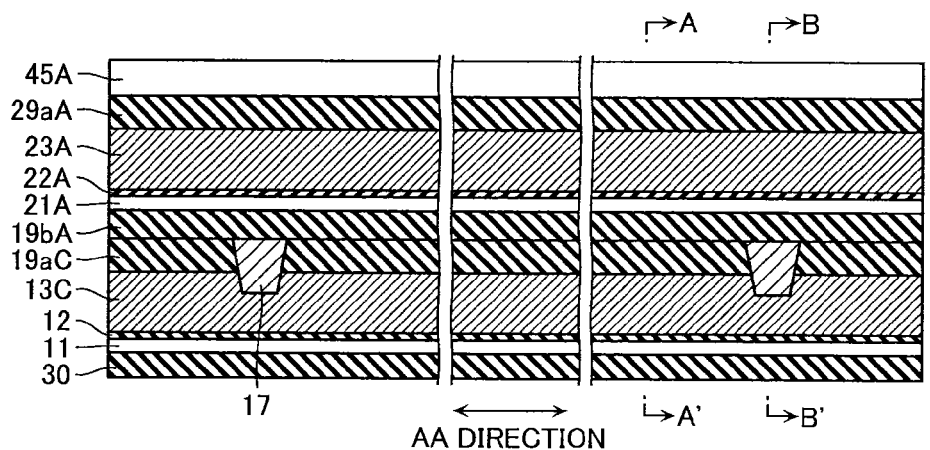
FIGS. 11A to 11C are cross-sectional diagrams that illustrate a portion of steps of manufacturing the memory cell array of the semiconductor memory device according to the same embodiment.
Figure 11B:
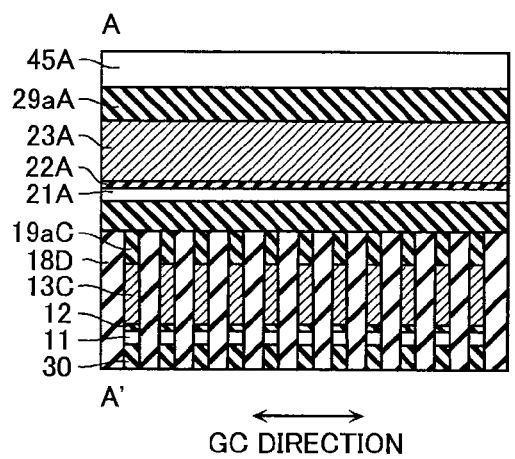
Figure 11C:
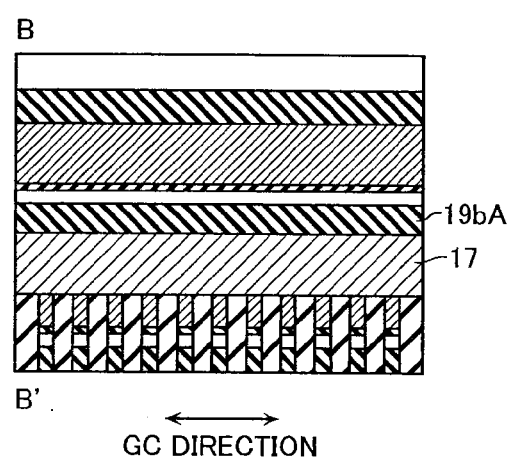
Figure 12A:
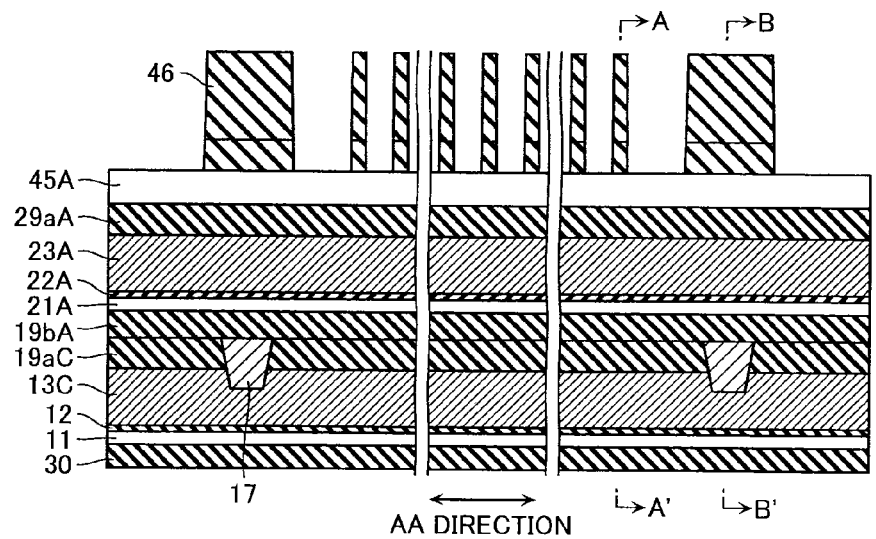
FIGS. 12A to 12C are cross-sectional diagrams that illustrate a portion of steps of manufacturing the memory cell array of the semiconductor memory device according to the same embodiment.
Figure 12B:
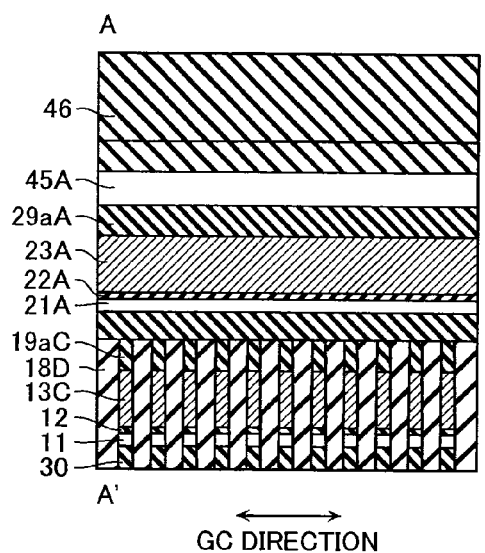
Figure 12C:
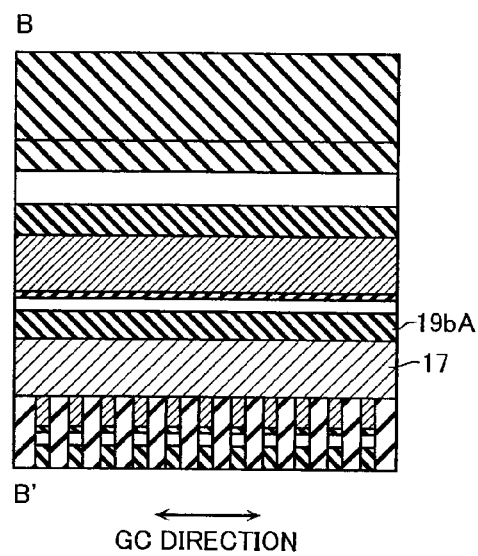
Figure 13A:
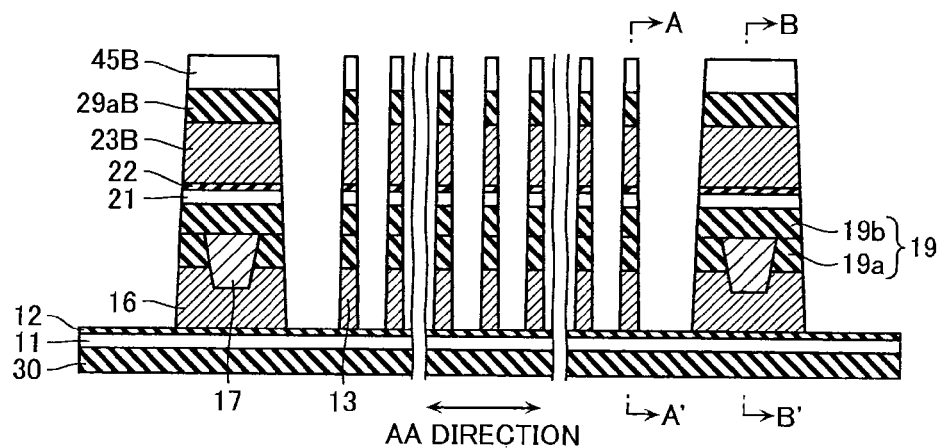
FIGS. 13A to 13C are cross-sectional diagrams that illustrate a portion of steps of manufacturing the memory cell array of the semiconductor memory device according to the same embodiment.
Figure 13B:
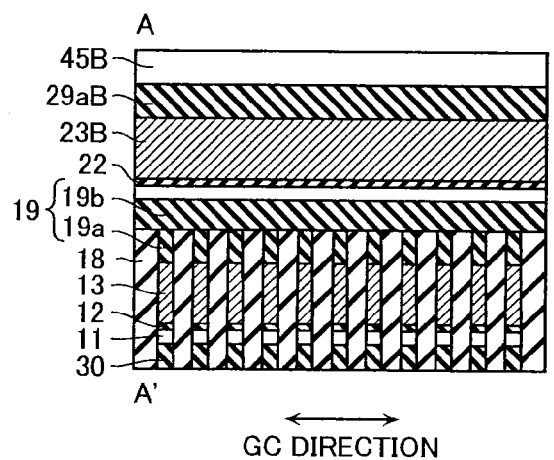
Figure 13C:
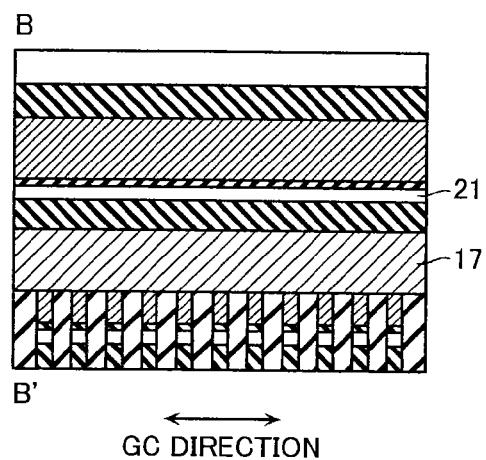

Subsequently, as illustrated in FIGS. 9A to 9C, the mask material 43 is removed, and the trench 17a for the select gate line is filled with the select gate line forming layer 17A. The select gate line forming layer 17A may be formed of polysilicon or metal (W, WSi, or the like.). Next, as illustrated in FIGS. 10A to 10C, overall etchback is performed so that the nitride layer 41C is removed and the select gate lines 17 extending in the GC direction are formed Next, as illustrated in FIGS. 11A to 11C, an inter-layer insulating layer 19bA, a semiconductor layer 21A to become the second semiconductor layer 21, a second gate insulating layer 22A to serve as the second gate insulating layer, a floating gate forming layer 23A, an insulating layer 29aA, and a nitride layer (Cap material) 45A are sequentially stacked on the inter-layer insulating layer 19aC and the select gate line 17. Subsequently, as illustrated in FIGS. 12A to 12C, a mask material 46 is further stacked, and a pattern arranged in the AA direction is formed. After that, as illustrated in FIGS. 13A to 13C, the stacked body is selectively etched up to the first gate insulating layer 12, and then the mask material 46 is removed. As a result, patterns arranged in the AA direction for the cell array layer 10 as the lower layer and the cell array layer 20 as the upper are simultaneously formed. As a result, the stacked structure of the first select gate 16 and the first select gate line 17, and the pattern arranged in the AA direction which is made up of the first floating gate 13 and the first inter-layer insulating layers 19a and 19b are formed in the first cell array layer 10; and the stacked pattern arranged in the AA direction and made up of the second semiconductor layer 21, the second gate insulating layer 22, the second floating forming layer 23B, the second inter-layer insulating layer 29aB, and the nitride layer 45B is formed in the second cell array layer 20. These patterns overlap in the stacking direction. In the RIE, it is desirable to prevent the semiconductor layer 11 from being etched. For this, it is desirable that an etching selectivity between the gate insulating layer 12 and a portion to be processed by etching is high.

Figure 14A:
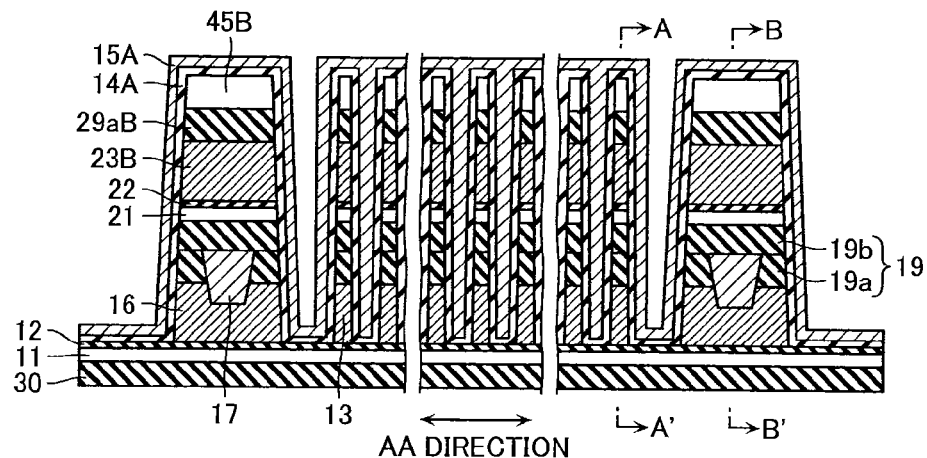
FIGS. 14A to 14C are cross-sectional diagrams that illustrate a portion of steps of manufacturing the memory cell array of the semiconductor memory device according to the same embodiment.
Figure 14B:
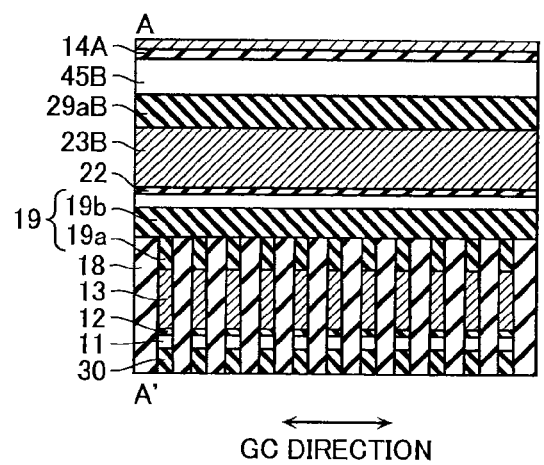
Figure 14C:
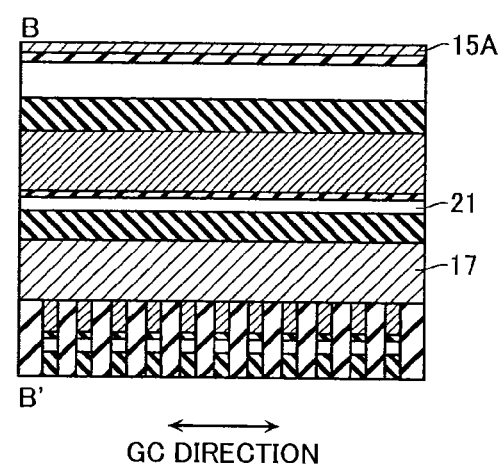
Figure 15A:
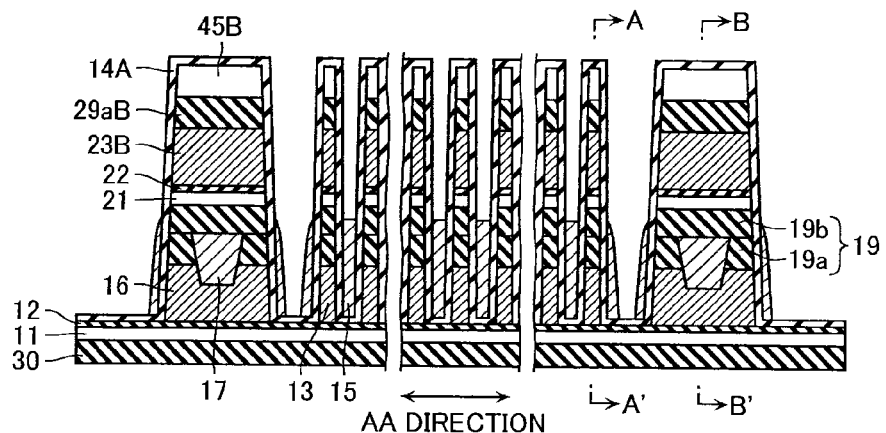
FIGS. 15A to 15C are cross-sectional diagrams that illustrate a portion of steps of manufacturing the memory cell array of the semiconductor memory device according to the same embodiment.
Figure 15B:
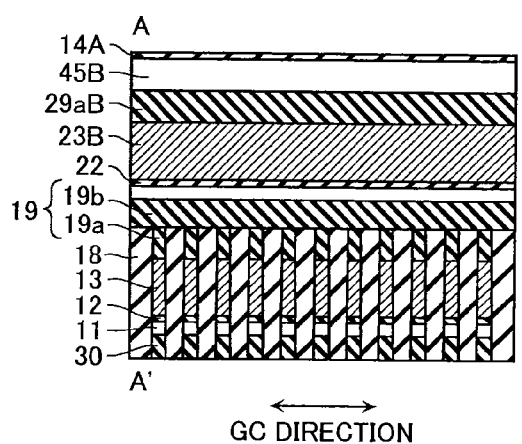
Figure 15C:
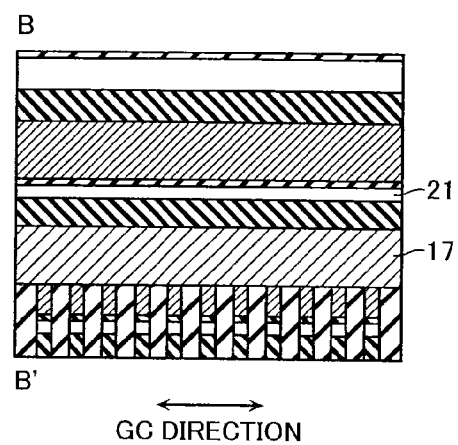

Next, as illustrated in FIGS. 14A to 14C, the entire stacked pattern arranged in the AA direction formed by performing the RIE is covered with an insulating layer 14A to become the inter-gated insulating layer 14A, then gaps between the insulating layer 14A are filled with a first conductive layer 15A to become the first control gates 15, further then an etching process is performed on the conductive layer 15. As a result, as illustrated in FIGS. 15A to 15C, the conductive layer 15A remains only at portions which face side walls of the first floating gates 13 and the first select gates 16, and the other portions are removed. As a result, the first control gates 15 are formed. The conductive layer 15A may be formed of polysilicon or metal (W, WSi or the like.).

Figure 16A:
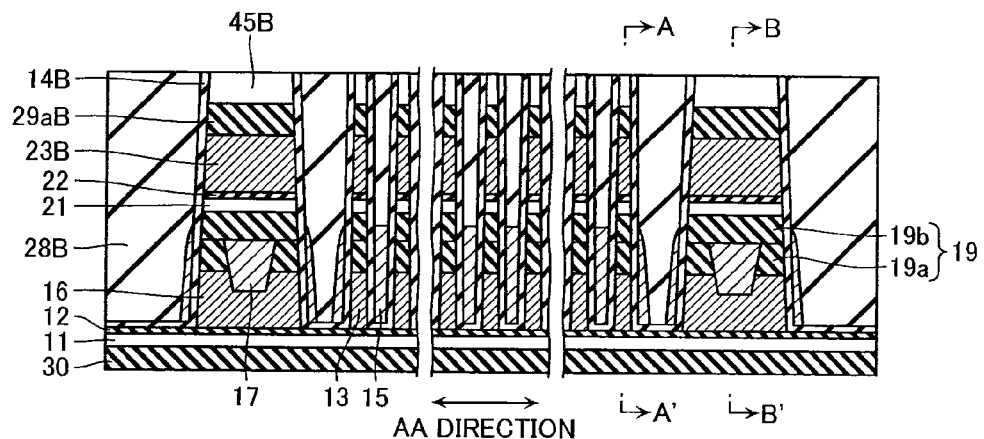
FIGS. 16A to 16C are cross-sectional diagrams that illustrate a portion of steps of manufacturing the memory cell array of the semiconductor memory device according to the same embodiment.
Figure 16B:
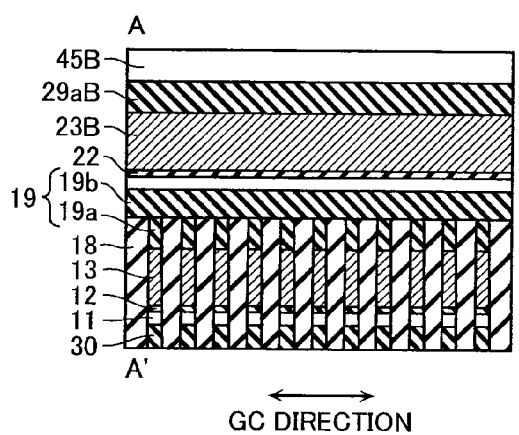
Figure 16C:
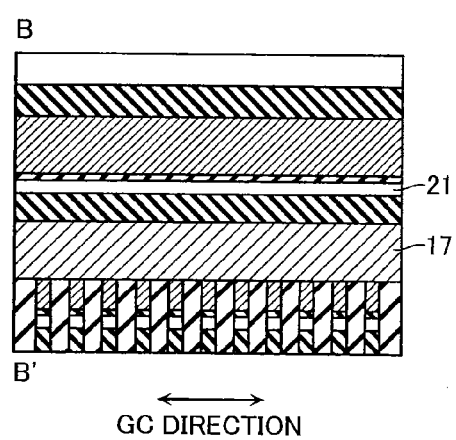

Next, as illustrated in FIGS. 16A to 16C, an insulating layer 28B to become a second inter-layer insulating layer 28 is embedded and the upper surfaces of the insulating layer 28B and the insulating layer 14A are removed by the CMP or the like so as to be planarized.

Next, as illustrated in FIGS. 17A to 17C, a mask material 47 for trench processing for formation of the second select gate line 27 is formed on the upper surfaces of the insulating layer 28B, the insulating layer 14B, and the nitride layer 45B. Next, the stacked body is selectively etched by the RIE using the mask material 47 until a floating gate forming layer 23B is exposed, so that a trench 27a for the second select gate line extending in the AA direction is formed as illustrated in FIGS. 17A to 17C.

Subsequently, as illustrated in FIGS. 18A to 18C, second control gates 27 are formed. First, the mask material 47 is removed, and then the select gate line forming layer (not illustrated) is embedded in the trench 27a. Polysilicon or the metal (W, WSi or the like) can be used as the select gate lime forming layer. Next, overall etchback is performed, and, as a result, the select gate lines 27 are formed in the trenches 27a.

Figure 19A:
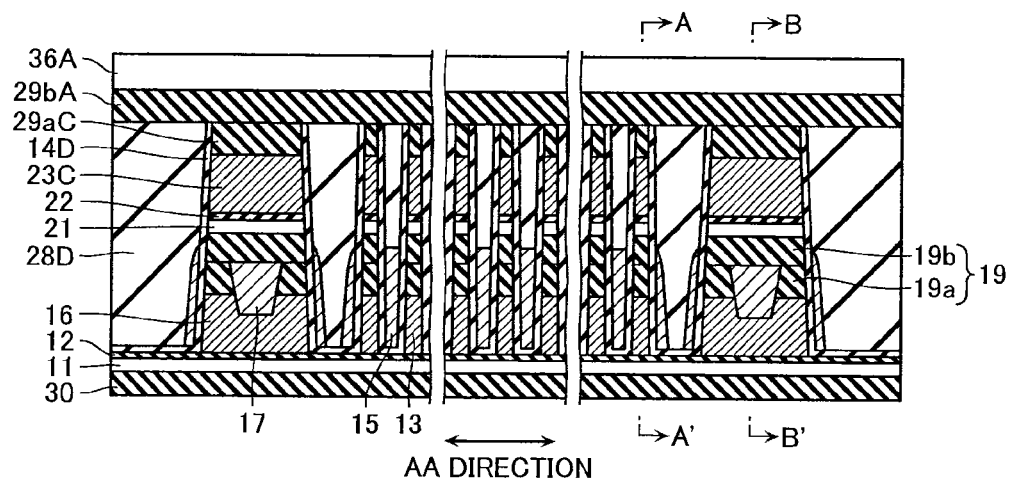
FIGS. 19A to 19C are cross-sectional diagrams that illustrate a portion of steps of manufacturing the memory cell array of the semiconductor memory device according to the same embodiment.
Figure 19B:
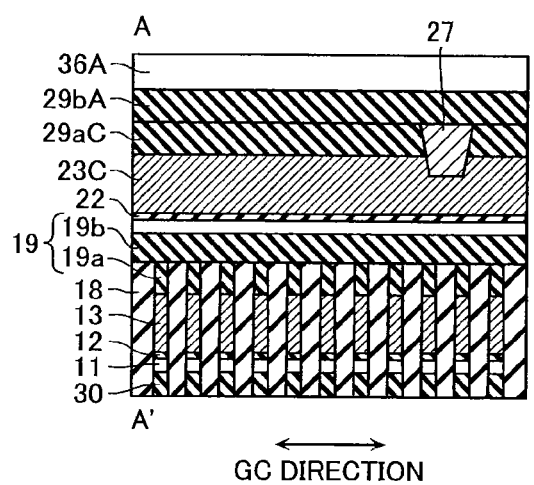
Figure 19C:
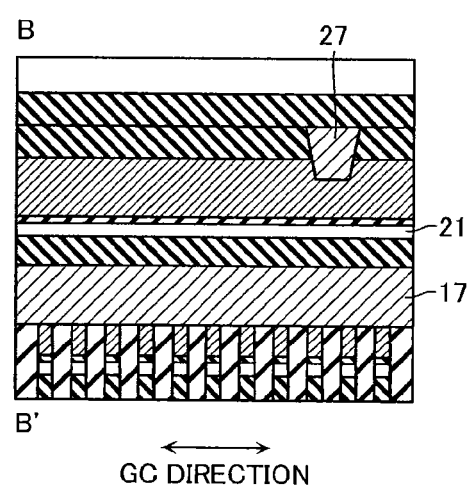
Figure 21A:
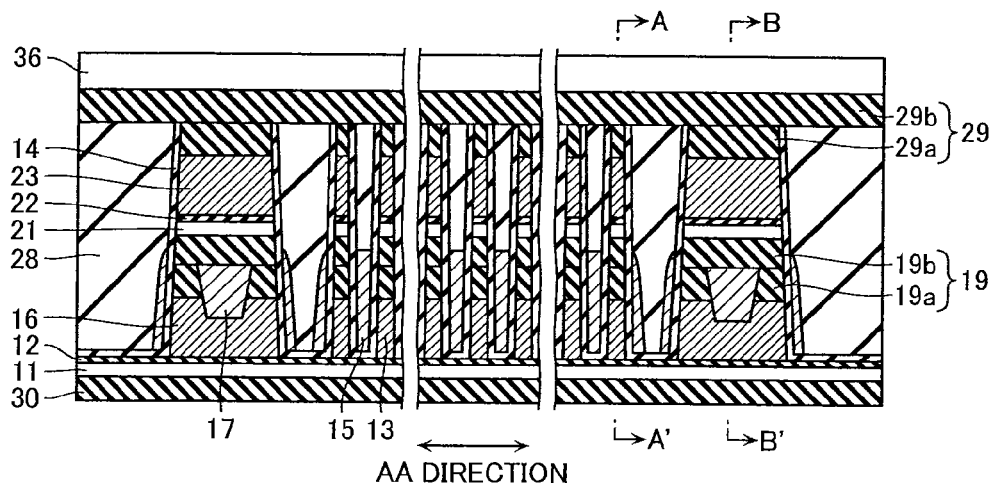
FIGS. 21A to 21C are cross-sectional diagrams that illustrate a portion of steps of manufacturing the memory cell array of the semiconductor memory device according to the same embodiment.
Figure 21B:
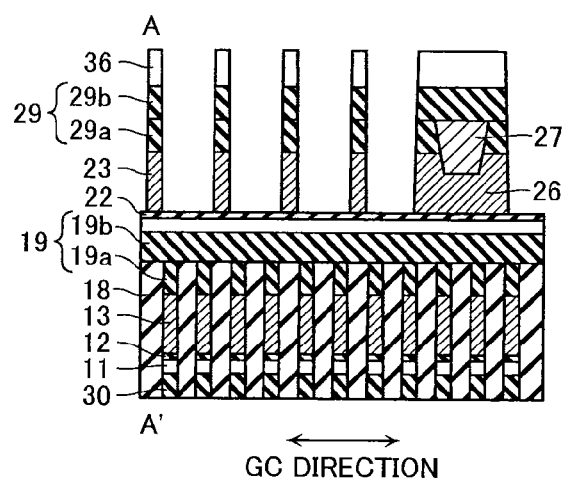
Figure 21C:
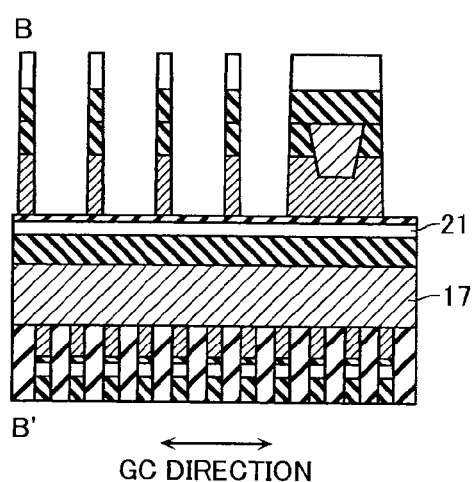

Next, an insulating layer 29bA and a nitride layer (cap material) 36A are stacked sequentially as illustrated in FIGS. 19A to 19C, then a mask material 48 is stacked as illustrated in FIGS. 20A to 20C, after that, the stacked body is selectively etched by the RIE until reaching the second gate insulating layer 22, and the mask material 48 is removed as illustrated in FIGS. 21A to 21C. As a result, the pattern in the GC direction of the cell array layer 20 as the upper layer is formed. That is, the pattern in the GC direction of the stacked body made up of the second floating gate 23, the second select gate 26, the second inter-layer insulating layers 29a and 29b, and the nitride layer (cap material) 36 is formed. In the RIE, it is desirable to prevent the second semiconductor layer 21 from being etched. For this, it is desirable that an etching selectivity between the second gate insulating layer 22 and a portion to be processed by etching is high.

Moreover, when forming the stacked body as the upper layer, the pitch in the GC direction of the second floating gates 23 is the product of the pitch in the GC direction of the first floating gate 13 as the lower layer multiplied by an even number, and a midway positions between the adjacent floating gates 23 in the GC direction is located not to overlap the first semiconductor layer 11 as the lower layer in the stacking direction. That is, the midway positions of the second floating gates 23 overlaps the inter-layer insulating layer 18 in the stacking layer.

After that, as illustrated in FIGS. 22A to 22C, the entire structure formed through RIE is covered with the second inter-gate insulating layer 24, a conductive layer (not illustrated) is embedded between the second inter-gate insulating layers 24, and overall etchback is performed on the entire surface of the conductive layer with RIE. As a result, the second control gates 25 are formed. The conductive layer to form the second control gates 25 may be formed of polysilicon or metal (W, WSi, or the like.). After that, a protective layer 37 is deposited over the entire surface of the stacked body, which results in the structure illustrated in FIGS. 22A to 22C.

Next, as illustrated in FIG. 1, electric contacts 31, 33, 34 which make a contact with the semiconductor layers 11 and 21 to serve as channel bodies, the control gates 15 and 25, and the select gate lines 17 and 27 are formed. The contacts 31, 33, and 34 are formed with the hole processing. General polysilicon electric contact and W electric contact are used as a contact material. Moreover, in the memory cell array structure according to the present embodiment, since the first semiconductor layer 11 of the lower cell array layer 10 and the semiconductor layer 21 of the upper cell array layer 20 are orthogonal to each other, the bit line contact 31 is arranged to pass through a portion between the second control gates 25. In such a configuration, the pitch of the memory cells MC of the second cell array layer 20 in the GC direction is multiplied by an even number (For example, twice) the pitch of the memory cells of the first cell array layer 10.

As described above, in the present embodiment, since the pattern of the AA direction which includes the first control gates 15 of the first cell array layer 10, and the pattern of the AA direction which includes the second semiconductor layer 21 of the second cell array layer 20 are collectively processed, it is possible to reduce the number of processes for manufacturing the memory cell array.

[Method for Manufacturing Memory Cell Array Structure According to Second Embodiment]

Although the memory cell array according to the first embodiment had the structure in which two layers of cell arrays are stacked, but the number of layers of cell arrays stacked may be two or more. For example, a memory cell array according to a second embodiment has the structure in which four layers of memory cell arrays are stacked. Hereafter, referring to FIGS. 23A to 37C, a method for manufacturing the structure of the memory cell array according to the second embodiment of the present invention is explained.

In the method for manufacturing the memory cell array according to the present embodiment, steps illustrated in FIGS. 5A to 18C are the same as in the first embodiment. After the structure illustrated in FIGS. 18A to 18C is manufactured, an insulating layer 29bA to become the second inter-layer insulating layer 29b, a semiconductor layer 51A to become a third semiconductor layer 51, an insulating layer 52A to become a third gate insulating layer 52, a floating gate forming layer 53A to become a third floating gate 53, an insulating layer 59aA to become lower parts of a third inter-layer insulating layers 59a, and a nitride layer 81A are sequentially stacked on insulating layers 28D, 14D, and 29aC so as to form the structure of FIGS. 23A to 23C. As for the semiconductor layer 51A, the insulating layer 52A, the floating gate layer 53A, the inter-layer insulating layer 59A, and the nitride layer 81A, to which the same material and forming methods as the semiconductor layer 11A, the insulating layer 12A, the floating gate layer 13A, the inter-layer insulating layer 19A, and the nitride layer 41A, may be used respectively.

Figure 24A:
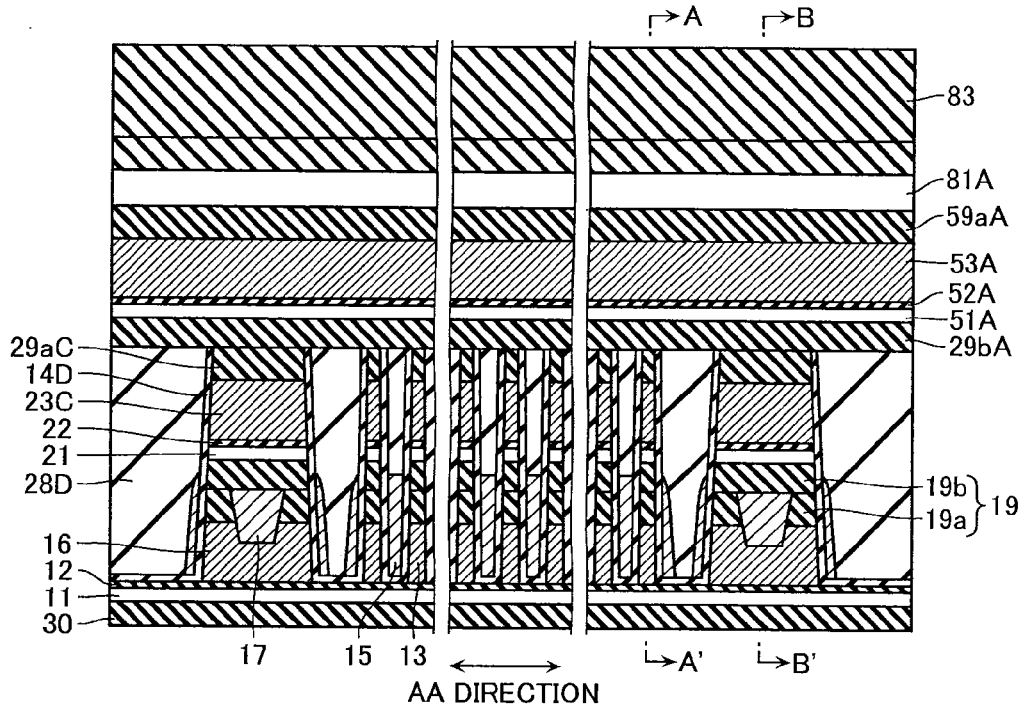
FIGS. 24A to 24C are cross-sectional diagrams that illustrate a portion of steps of manufacturing the memory cell array of the semiconductor memory device according to the same embodiment.
Figure 24B:
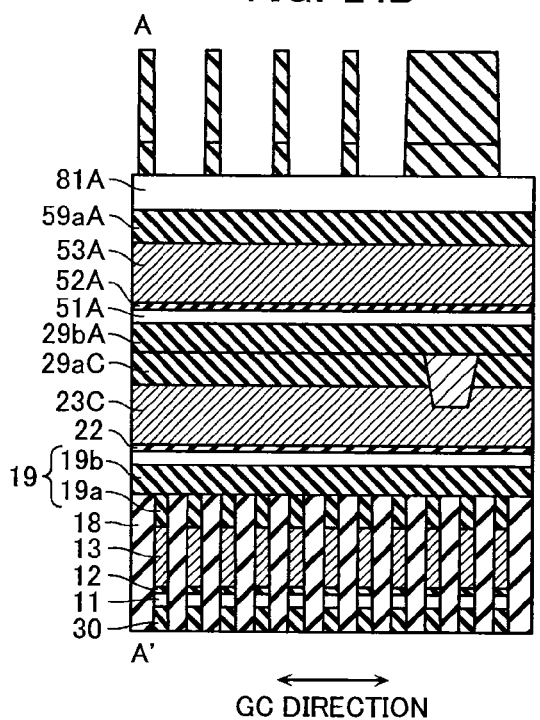
Figure 24C:
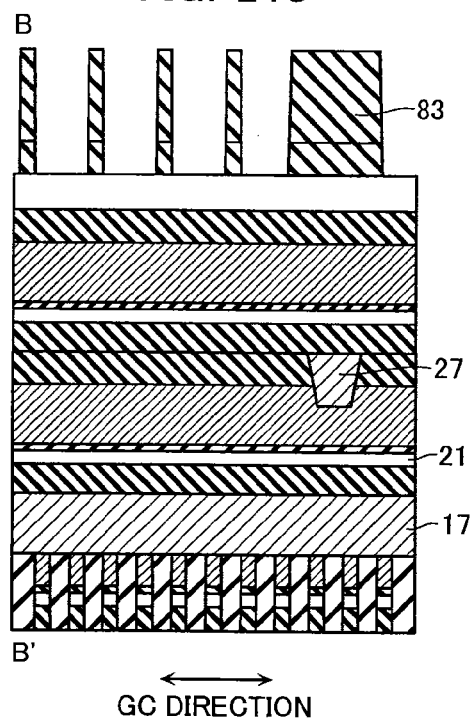

Next, a mask material 83 is stacked on the nitride layer 81A as illustrated in FIGS. 24A to 24C, RIE is performed, and the mask material 83 is removed as illustrated in FIGS. 25A to 25C. The stacked body is selectively etched up to the bottom of the floating gate formation layer 23C with the etching to process the AA pattern. As a result, the second floating gates 23, the second select gates 26, the second inter-layer insulating layers 28 and 29, third semiconductor layers 51, the third gate insulating layers 52, the floating gate forming layer 53B, the insulating layer 59aB, and the nitride layer 81B are formed. The etching may be performed in a single stage or divided into two or more stages.

Moreover, when forming the stacked body as the upper layer, like the first embodiment, the pitch in the GC direction of the second floating gates 23 is multiplied by even number (For example, twice) the pitch in the GC direction of the first floating gate 13 as the lower layer, and a midway position between the adjacent second floating gates 23 in the GC direction is located not to overlap the first semiconductor layer 11 as the lower layer in the stacking direction. That is, the midway position overlaps the inter-layer insulating layer 18 in the stacking layer.

Figure 26A:
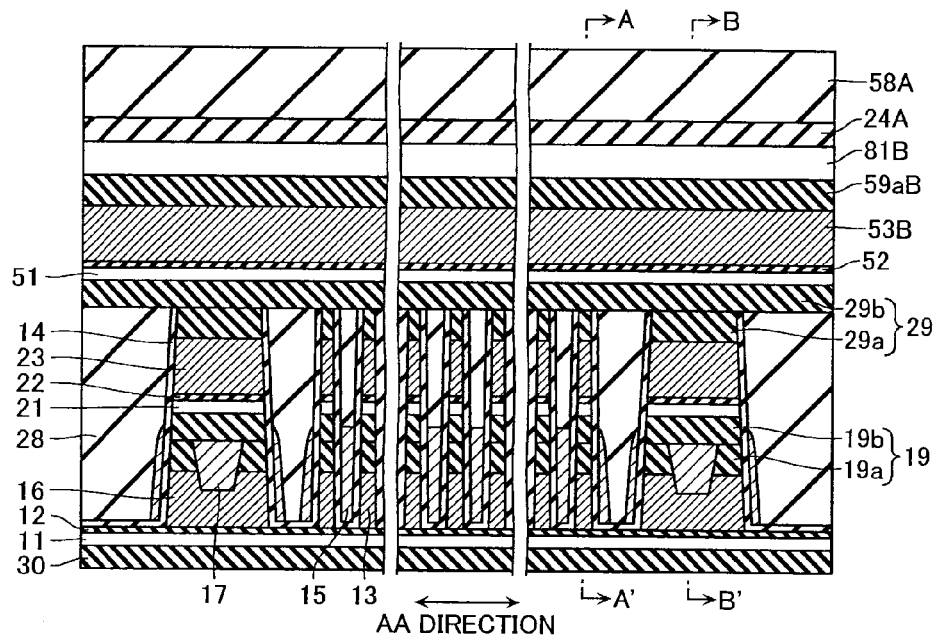
FIGS. 26A to 26C are cross-sectional diagrams that illustrate a portion of steps of manufacturing the memory cell array of the semiconductor memory device according to the same embodiment.
Figure 26B:
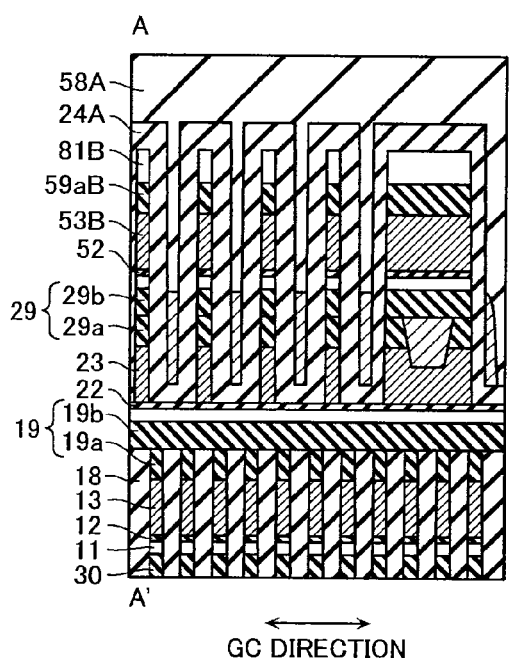
Figure 26C:
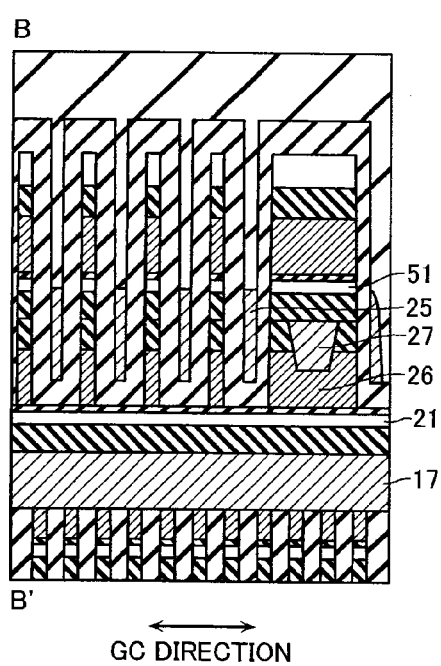

Next, the entire structure formed through the RIE is covered with the second inter-gate insulating layer 24A, the gaps between the inter-gate insulating layers 24A are filled with a conductive layer (not illustrated in the drawing). Next, the conductive layer is etched to be removed such that the conductive layer remains only on portions which face the second floating gate layer 23 and the second select gate transistor 26. As a result, the second control gates 25 are formed. The conductive layer may be formed of polysilicon or metal (W, WSi, or the like.). Next, as illustrated in FIGS. 26A to 26C, the insulating layer 24A and the second control gates 25 are covered with an insulating layer 58A.

Figure 27A:
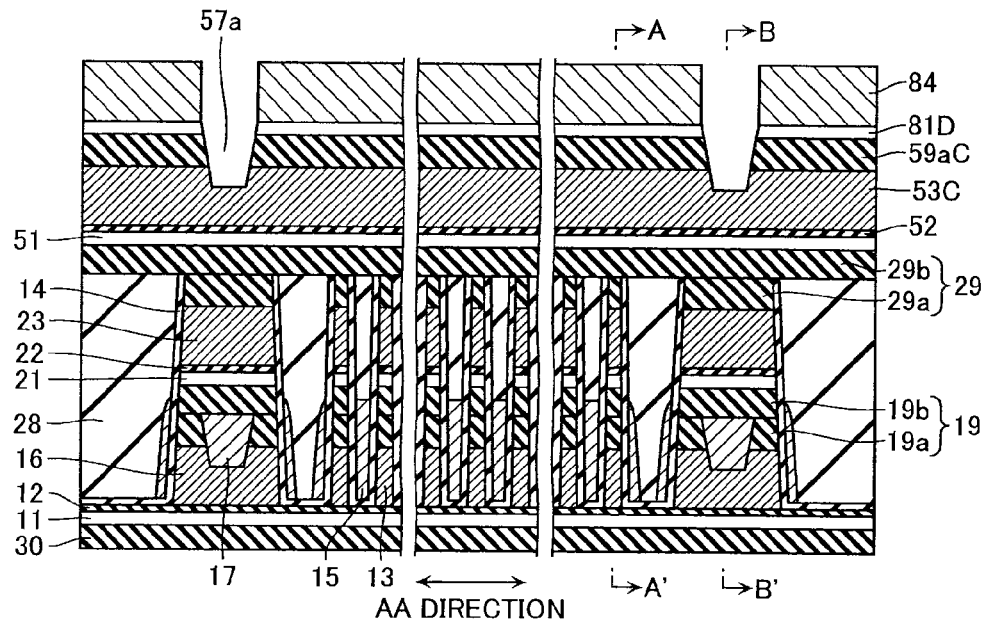
FIGS. 27A to 27C are cross-sectional diagrams that illustrate a portion of steps of manufacturing the memory cell array of the semiconductor memory device according to the same embodiment.
Figure 27B:
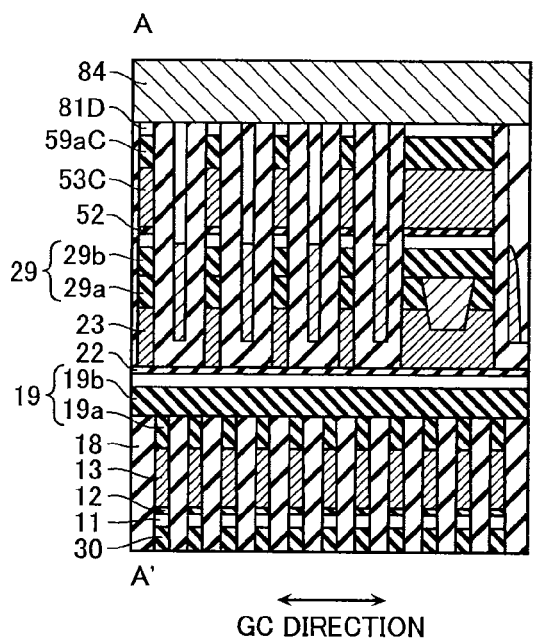
Figure 27C:
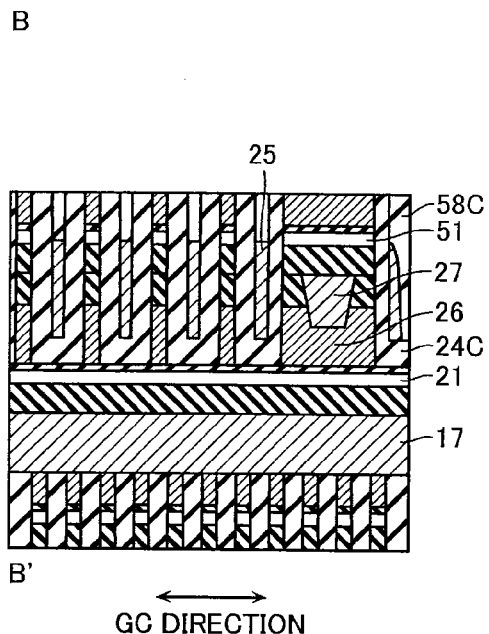

Next, a mask material 84 is stacked on the upper surfaces of the insulating layer 58A, the insulating layer 24A, the nitride layer 81B, and then the stacked body is selectively etched with RIE until the floating gate forming layer 53B is exposed, so that a trench 57a for the third select gate line extending in the GC direction is formed as illustrated in FIGS. 27A to 27C. As a result, the floating gate forming layer 53C, the insulating layer 59aC, the nitride layer 81D, the insulating layer 58C, and the insulating layer 24C are formed. It is desirable that this RIE is performed under conditions in which an etching selectivity with respect to the third gate insulating layer 52 is high and the third semiconductor layer 51 is not etched.

Subsequently, third control gates 56 are formed. First, the mask material 84 is removed, and then the control gate line forming layer (not illustrated in the drawing) is embedded in the trench 57a. The control gate forming layer may be formed of polysilicon or metal (W, WSi or the like.). Next, overall etchback is performed so that the nitride layer 81D is removed and the select gate lines 57 and the insulating layers 24D and 58D are formed as illustrated in FIGS. 28A to 28C.

Figure 28A:
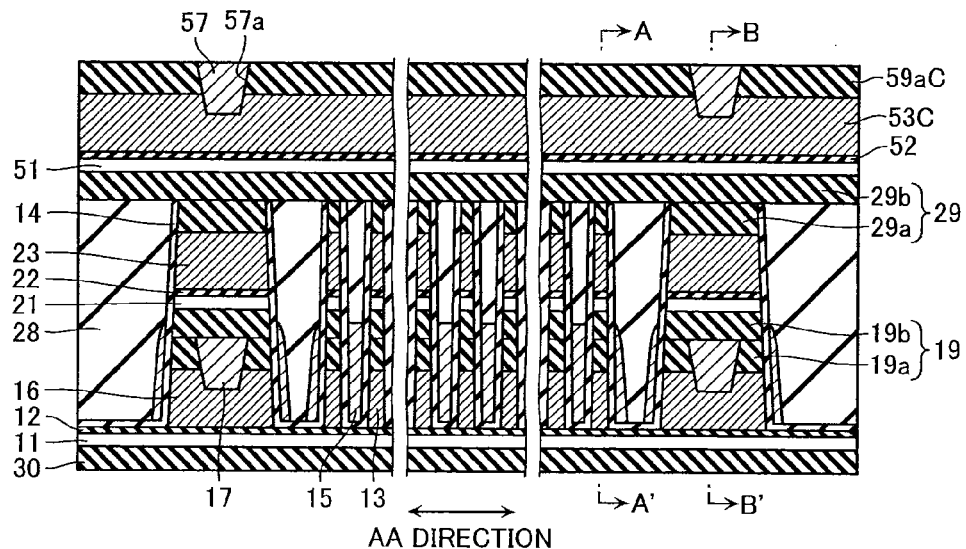
FIGS. 28A to 28C are cross-sectional diagrams that illustrate a portion of steps of manufacturing the memory cell array of the semiconductor memory device according to the same embodiment.
Figure 28B:
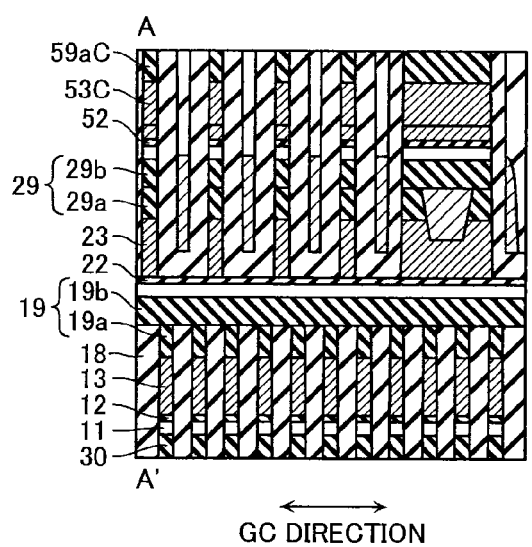
Figure 28C:
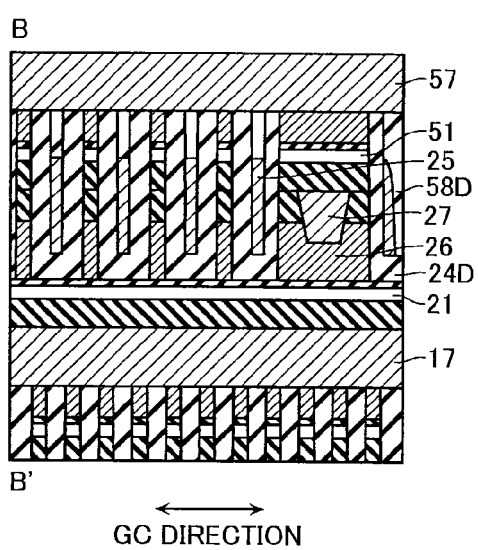
Figure 29A:
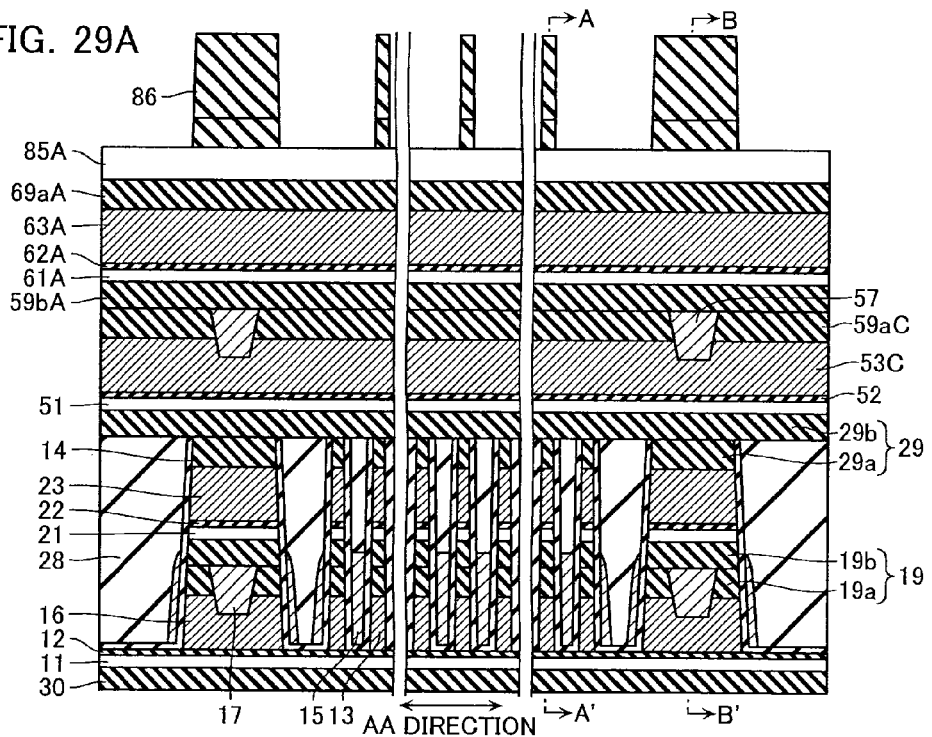
FIGS. 29A to 29C are cross-sectional diagrams that illustrate a portion of steps of manufacturing the memory cell array of the semiconductor memory device according to the same embodiment.
Figure 29B:
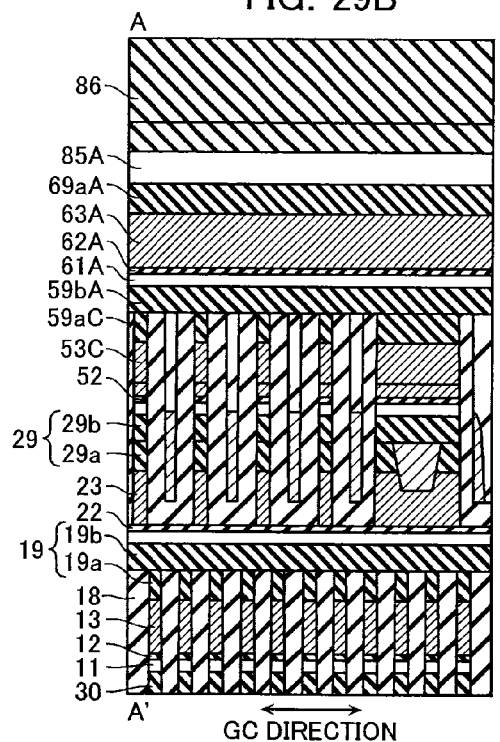
Figure 29C:
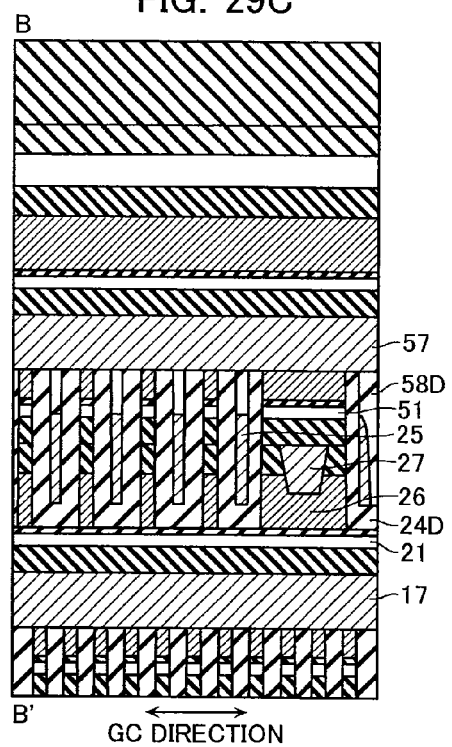
Figure 30A:
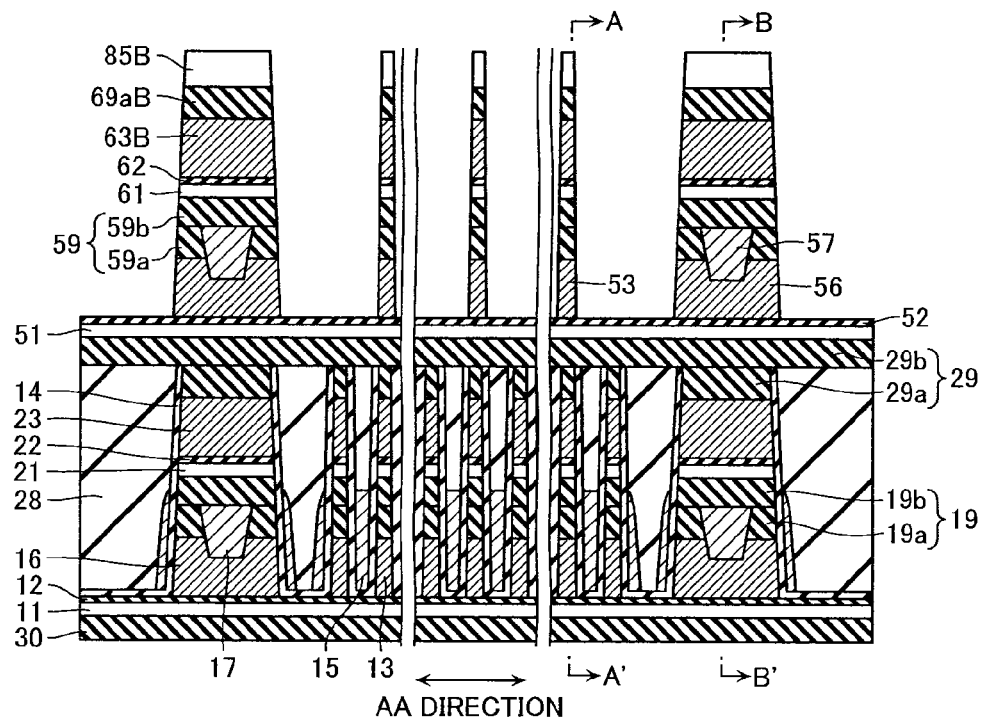
FIGS. 30A to 30C are cross-sectional diagrams that illustrate a portion of steps of manufacturing the memory cell array of the semiconductor memory device according to the same embodiment.
Figure 30B:
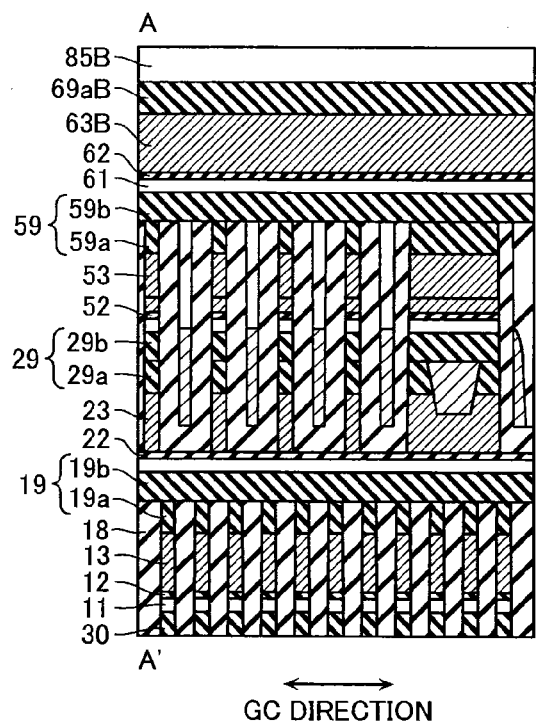
Figure 30C:
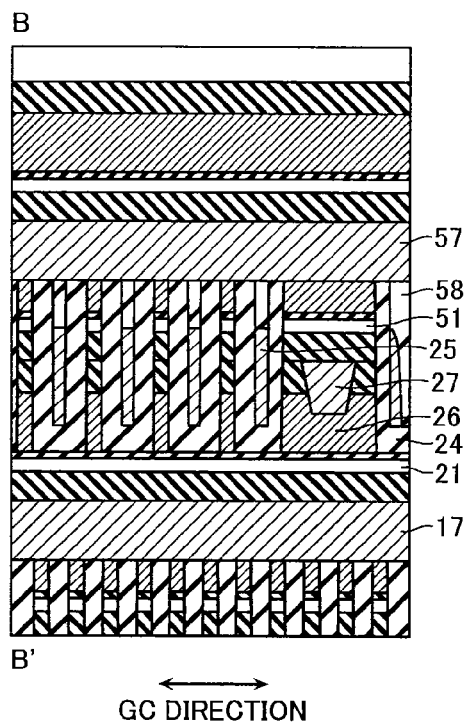

Next, as illustrated in FIGS. 29A to 29C, an insulating layer 59bA, a fourth semiconductor layer 61A, a fourth gate insulating layer 62A, a fourth floating gate forming layer 63A, an insulating layer 69aA, a nitride layer 85A, and a mask material 86 are sequentially stacked on the structure illustrated in FIGS. 28A to 28C. The materials, and so on thereof are similar to those of the corresponding first to third layers. Next, as illustrated in FIGS. 30A to 30C, RIE is performed using the nitride layer 85A and the mask material 86, so that process steps for the stacked structure are carried out up to the formation of the floating gates 53C. Through this process, the third floating gate 53, the third select gate 56, the third inter-layer insulating layers 59a and 59b, the fourth semiconductor layer 61, the fourth gate insulating layer 62, the floating gate forming layer 63B, the insulating layer 69aB, and the nitride layer 85B are formed. The etching may be performed in a single stage or divided into two or more stages.

Figure 31A:
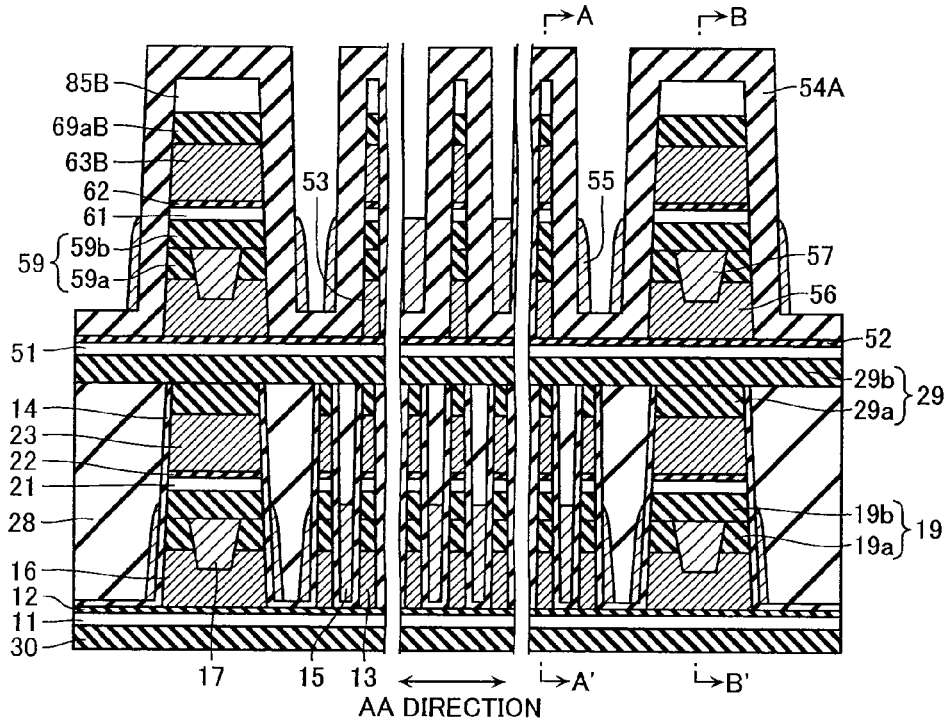
FIGS. 31A to 31C are cross-sectional diagrams that illustrate a portion of steps of manufacturing the memory cell array of the semiconductor memory device according to the same embodiment.
Figure 31B:
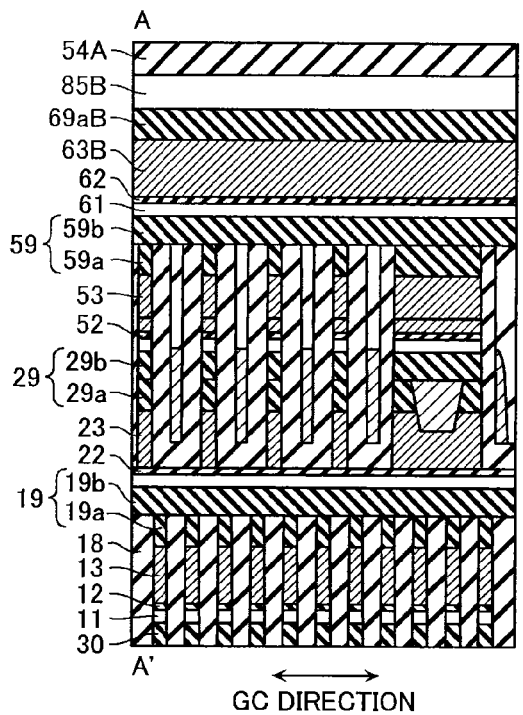
Figure 31C:
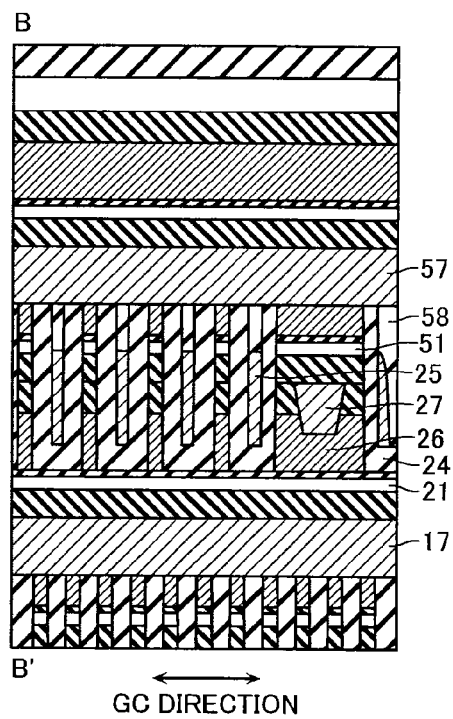

Next, the entire structure formed through the RIE is covered with the third inter-layer insulating layer 54A, the gaps between the inter-gate insulating layers 54A are filled with a conductive layer (not illustrated in the drawing). Next, the conductive layer is etched to be removed such that the conductive layer remains only on portions which face the third floating gate layer 53 and the third select gate transistor 56. As a result, the third control gates 55 are formed as illustrated in FIGS. 31A to 31C. The conductive layer may be formed of polysilicon or metal (W, WSi or the like.).

Figure 32A:
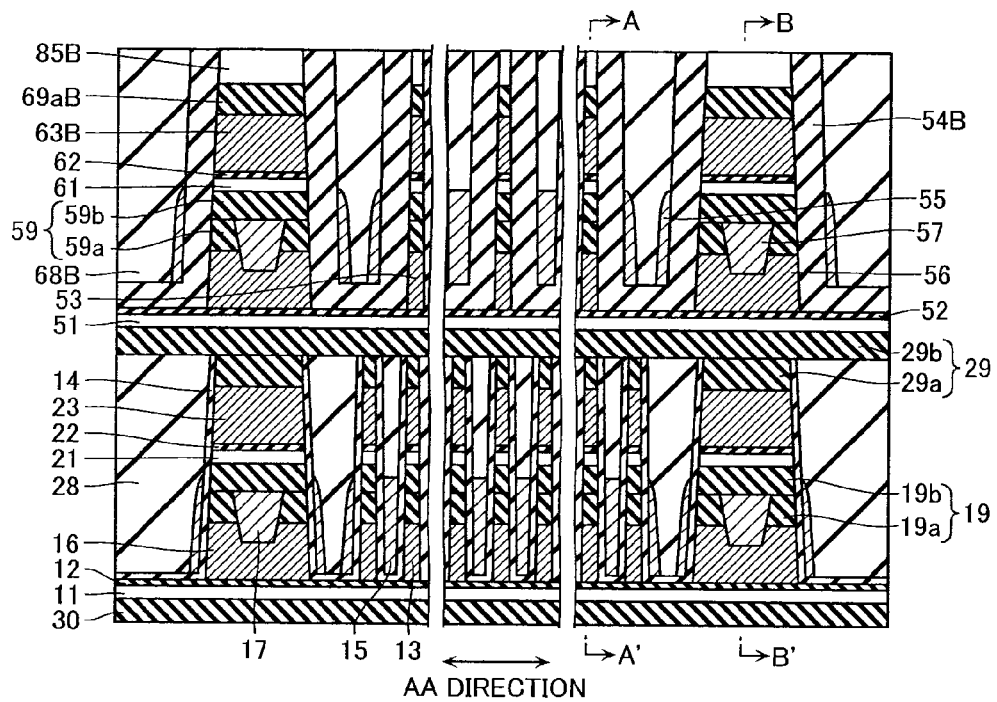
FIGS. 32A to 32C are cross-sectional diagrams that illustrate a portion of steps of manufacturing the memory cell array of the semiconductor memory device according to the same embodiment.
Figure 32B:
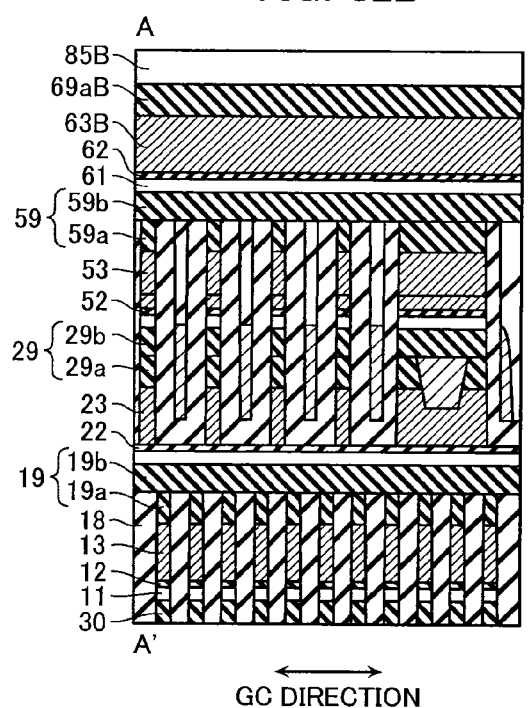
Figure 32C:
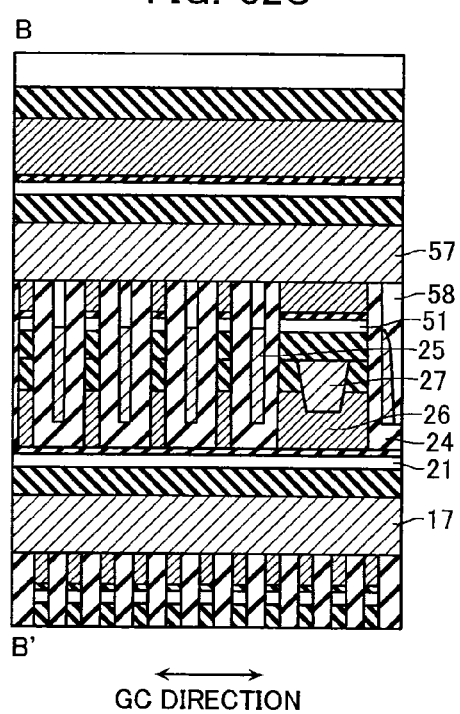

Next, the insulating layer 54A and the third control gates 55 are covered with an insulating layer, and CMP is performed on the upper surfaces of the insulating layer and the third inter-gate insulating layer 54A until the nitride layer 85B is exposed, so that an insulating layer 68B and an insulating layer 54B are formed as illustrated in FIGS. 32A to 32C.

Figure 33A:
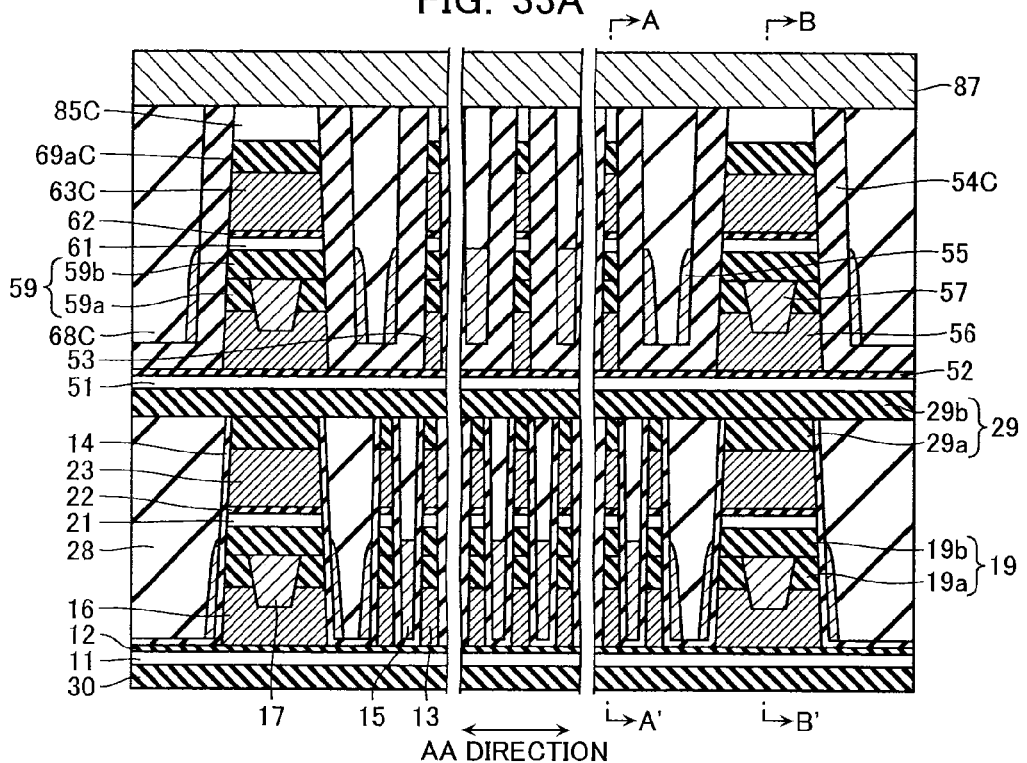
FIGS. 33A to 33C are cross-sectional diagrams that illustrate a portion of steps of manufacturing the memory cell array of the semiconductor memory device according to the same embodiment.
Figure 33B:
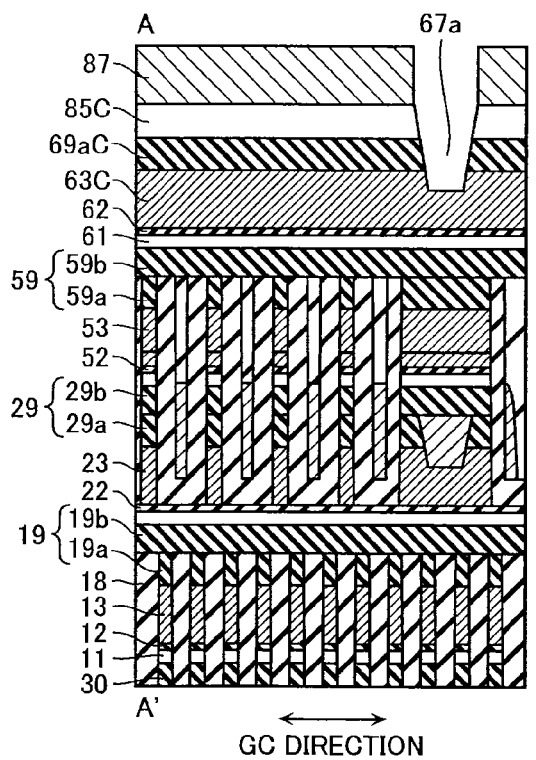
Figure 33C:
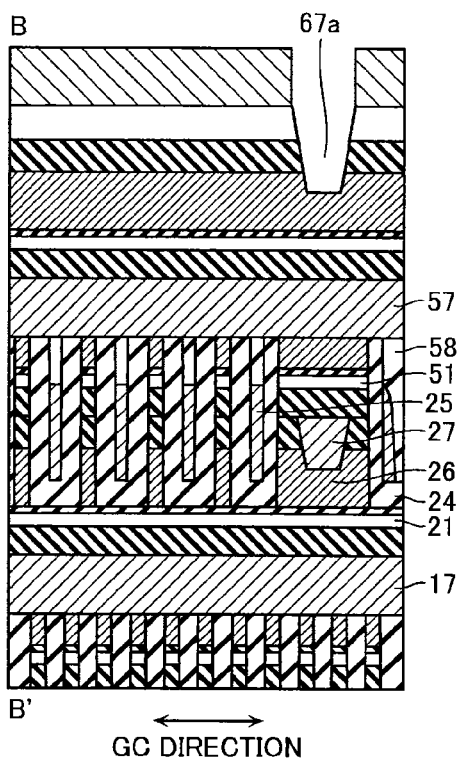

Next, a mask material 87 is stacked on the upper surfaces of the insulating layer 68B, and the insulating layer 54B, and the nitride layer 85B, and then the stacked body is selectively etched with RIE until the floating gate forming layer 63B is exposed, so that a trench 67a for the fourth select gate line extending in the AA direction is formed. As a result, as illustrated in FIGS. 33A to 33C, a floating gate forming layer 63C, an insulating layer 69aC, a nitride layer 85C, insulating layers 54C and 68C are formed. It is desirable that this GC pattern processing may be carried out by an etching process having a high selectivity with respect to the fourth gate insulating layer 62 and that the fourth semiconductor layer 61 is not etched.

Figure 34A:
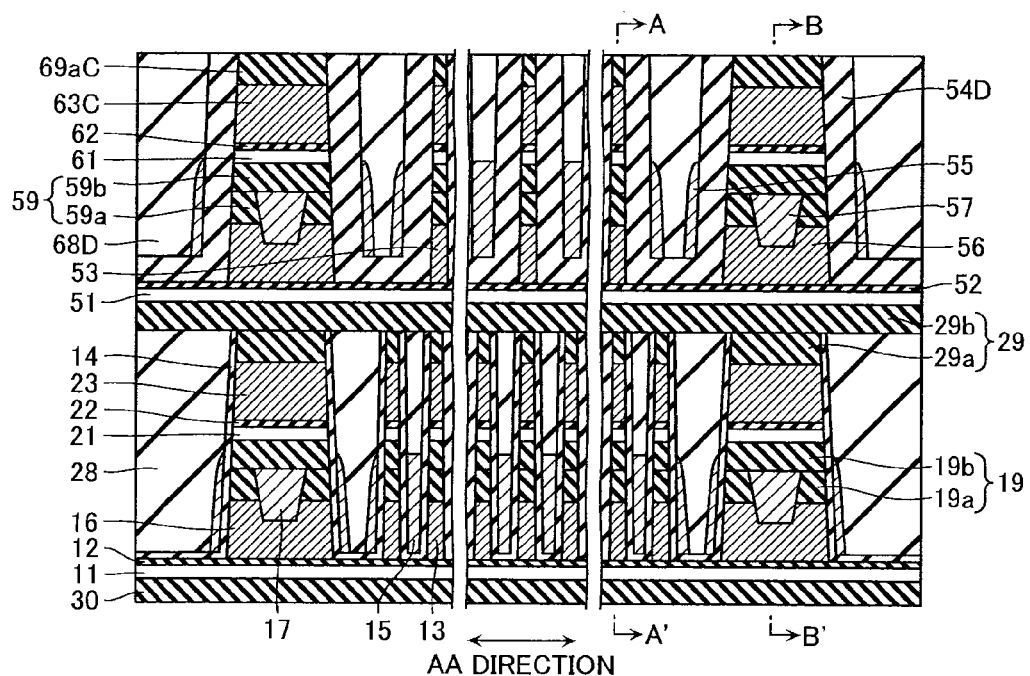
FIGS. 34A to 34C are cross-sectional diagrams that illustrate a portion of steps of manufacturing the memory cell array of the semiconductor memory device according to the same embodiment.
Figure 34B:
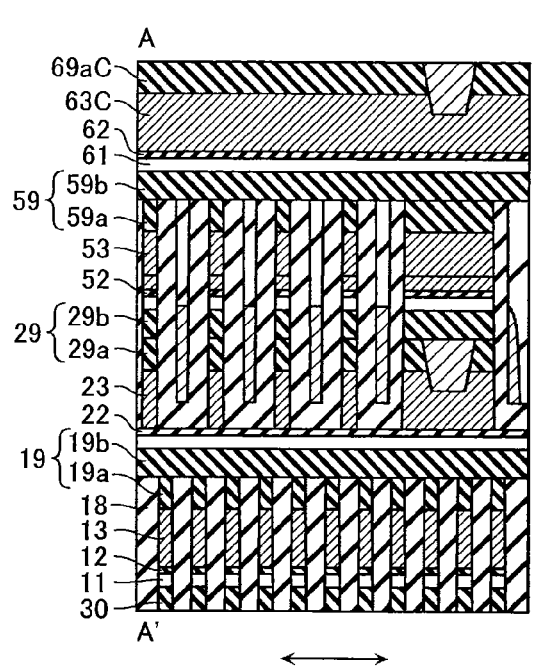
Figure 34C:
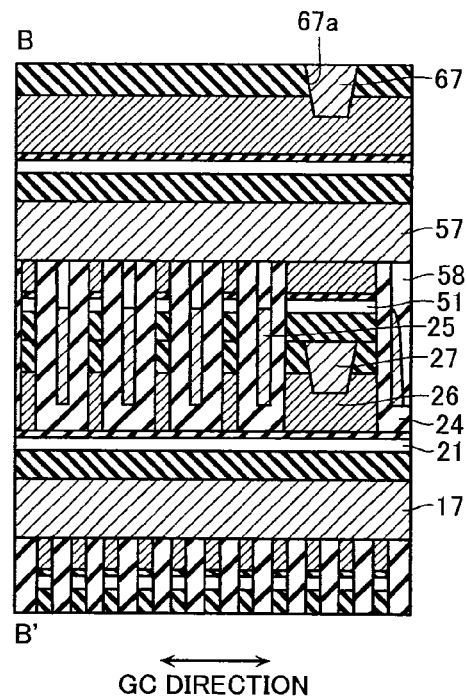

Subsequently, as illustrated in FIGS. 34A to 34C, fourth control gate lines 67 are formed. First, the mask material 87 is removed, and then the select gate line forming layer (not illustrated in the drawing) is embedded in the trench 67a. The select gate line forming layer may be formed of polysilicon or metal (W, WSi or the like.). Next, overall etchback is performed so that the nitride layer 85C is removed and the select gate lines 67 and the insulating layers 54D and 68D are formed.

Figure 35A:
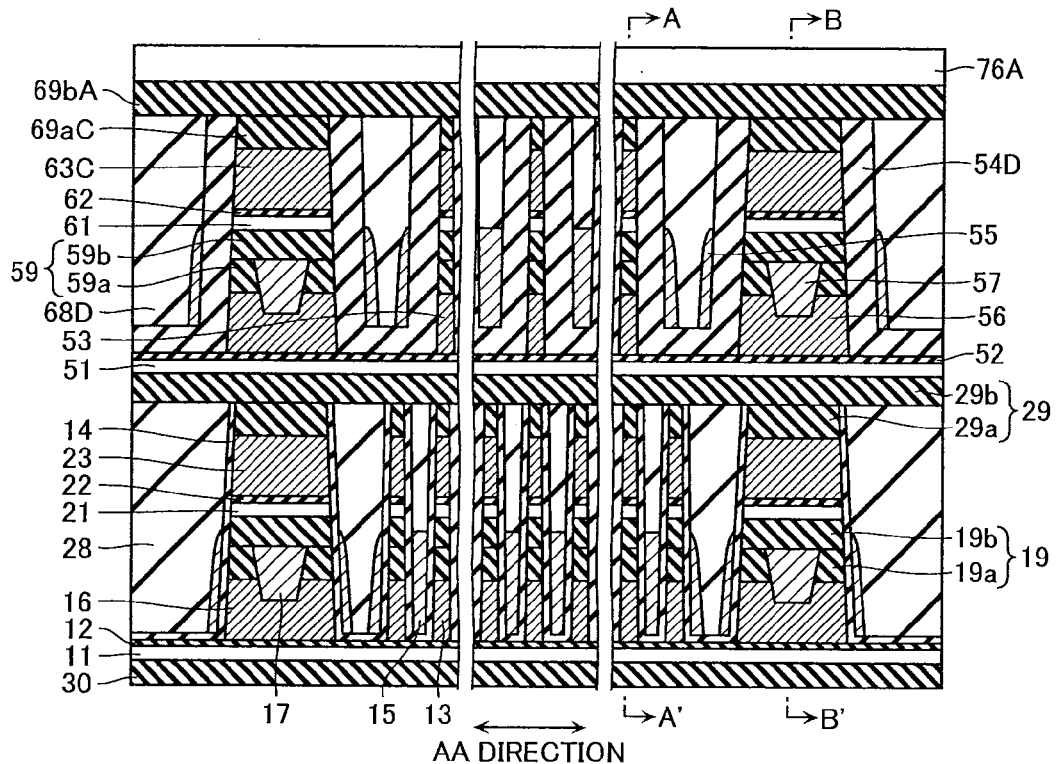
FIGS. 35A to 35C are cross-sectional diagrams that illustrate a portion of steps of manufacturing the memory cell array of the semiconductor memory device according to the same embodiment.
Figures 35B, 35C:
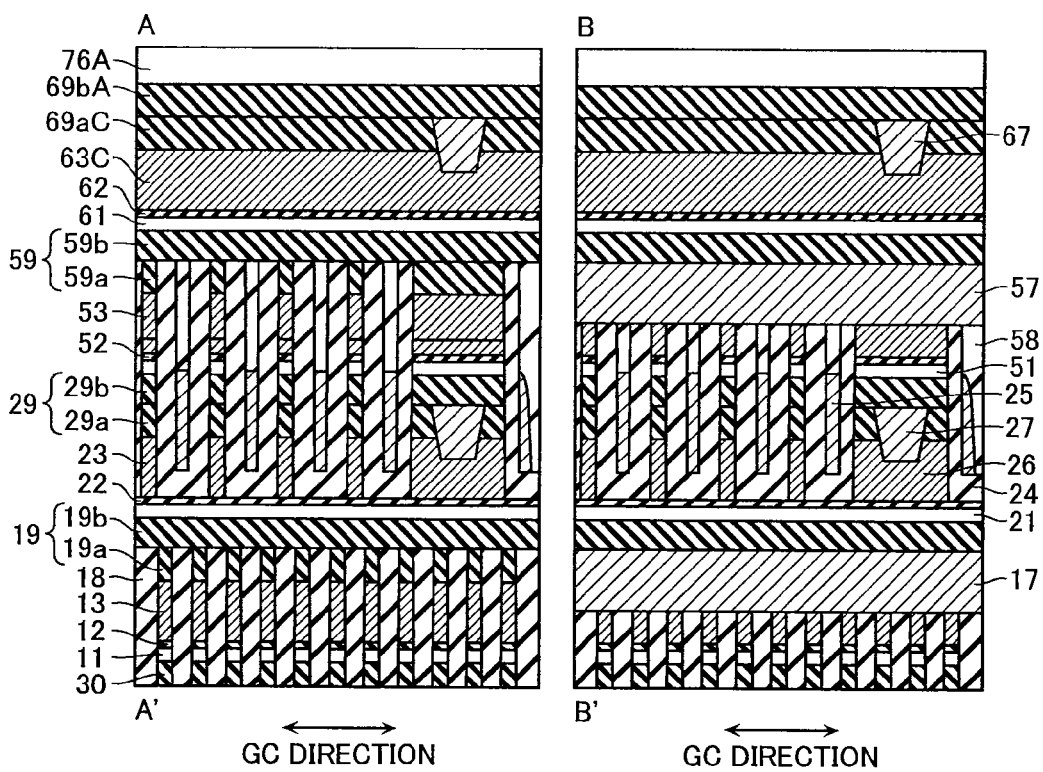
Figure 36A:
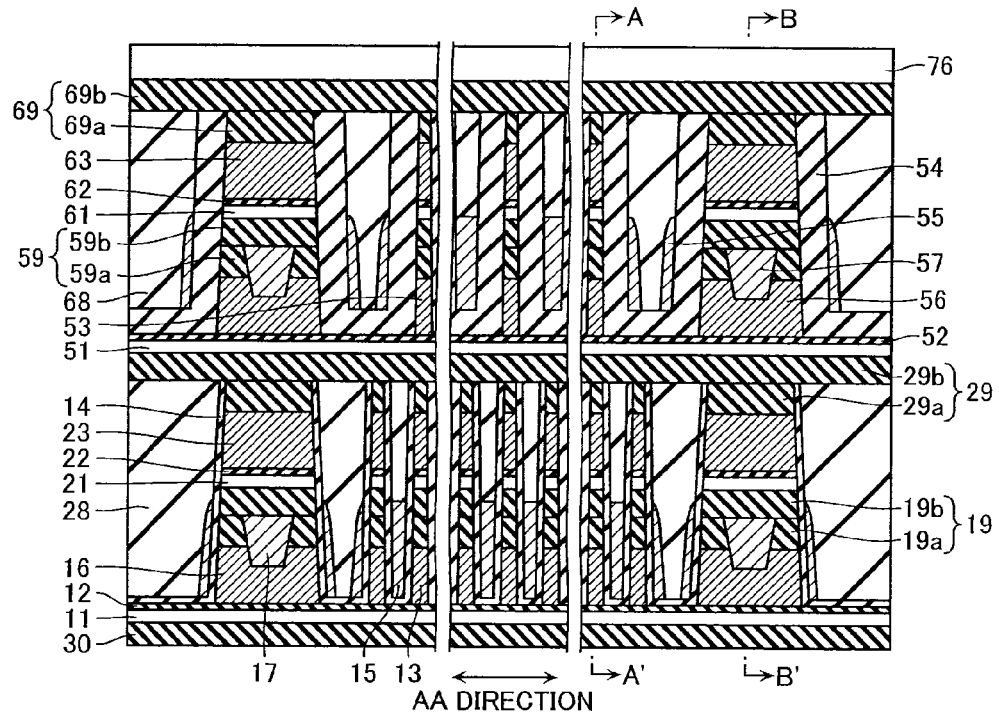
FIGS. 36A to 36C are cross-sectional diagrams that illustrate a portion of steps of manufacturing the memory cell array of the semiconductor memory device according to the same embodiment.
Figure 36B:
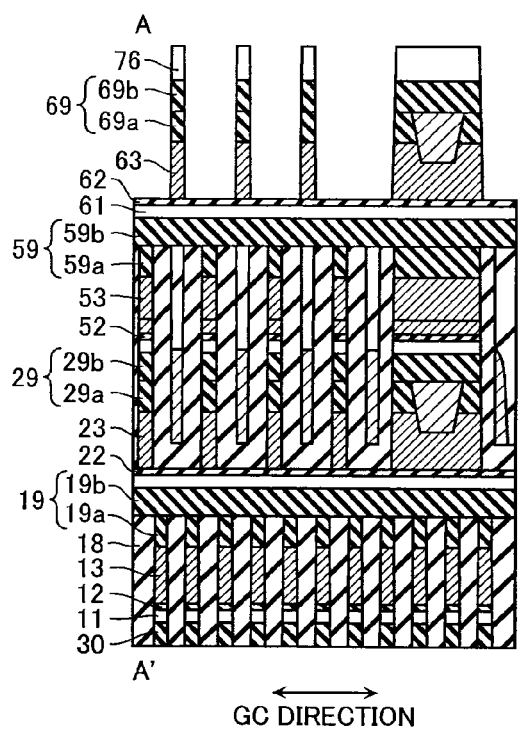
Figure 36C:
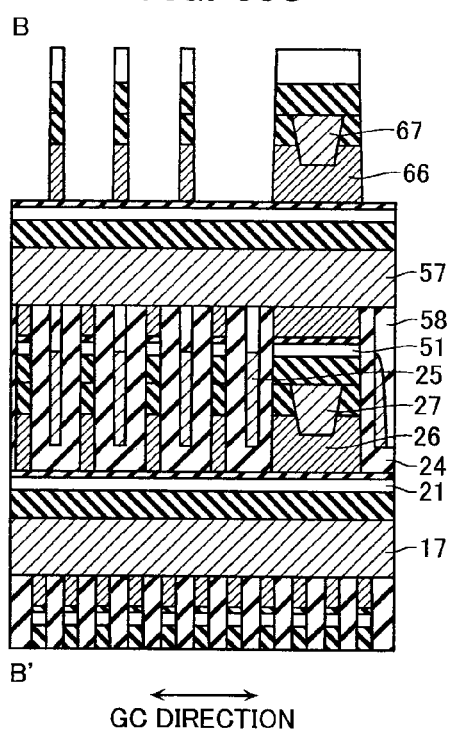
Figure 37A:
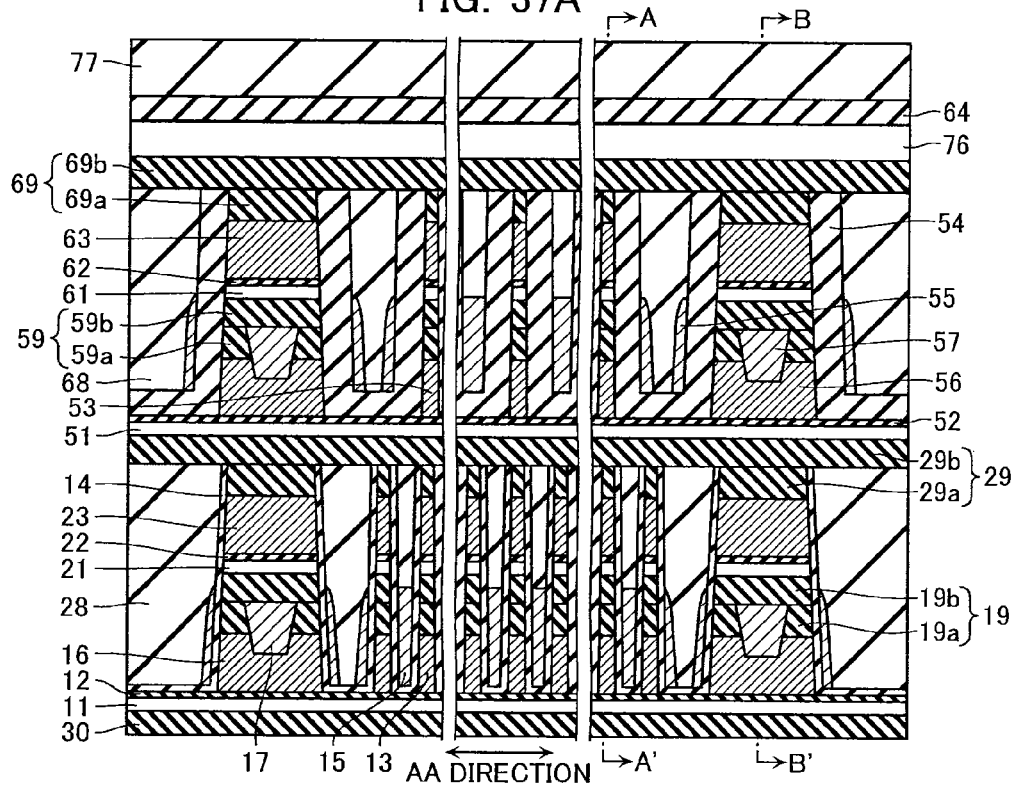
FIGS. 37A to 37C are a cross-sectional diagrams that illustrate a portion of steps of manufacturing the memory cell array of the semiconductor memory device according to the same embodiment.
Figure 37B:
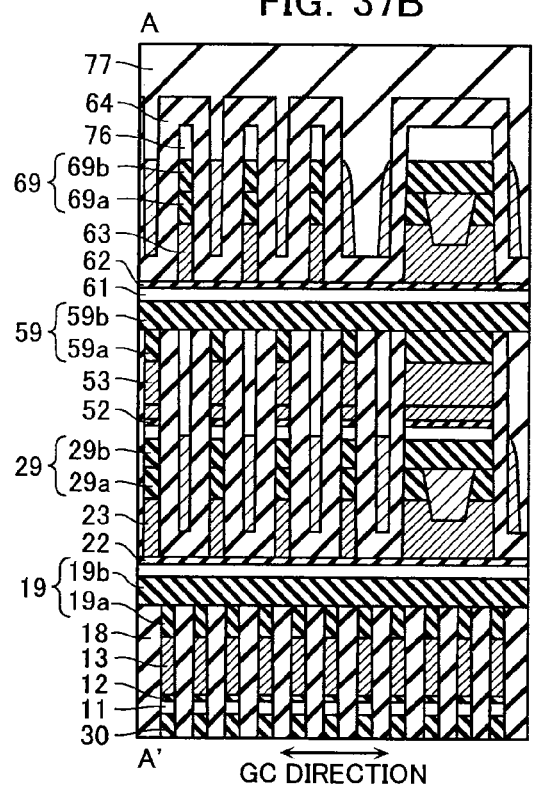
Figure 37C:
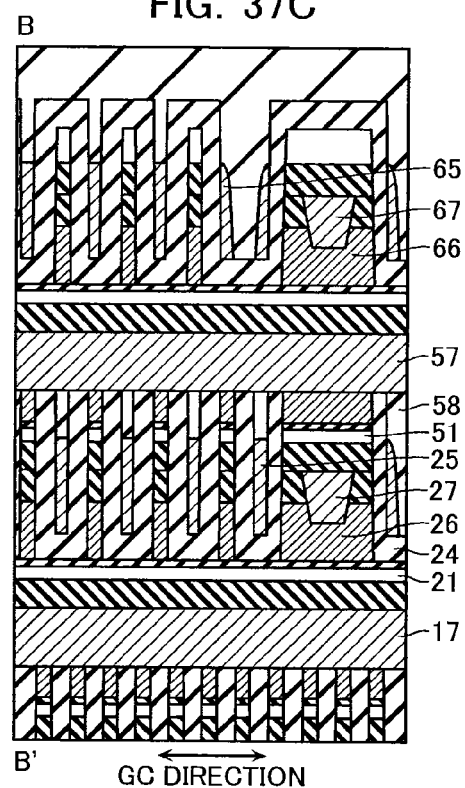

Next, as illustrated in FIGS. 35A to 35C, an insulating layer 69bA and a nitride layer 76A are stacked on the structure illustrated in FIGS. 34A to 34C. Subsequently, after a mask material (not illustrated in the drawing) is stacked, RIE is performed as illustrated in FIGS. 36A to 36C to form the fourth floating gates 63, the fourth select gates 66, the fourth inter-layer insulating layer 69, and the nitride layer 76. In the RIE, it is desirable to prevent the fourth semiconductor layer 61 from being etched. For this, it is desirable that an etching selectivity between the fourth gate insulating layer 62 and a portion to be processed by etching is high.

After that, the entire structure obtained through the RIE is covered with the fourth inter-gate insulating layers 64, gaps between the fourth inter-gate insulating layers 64 are filled with a conductive layer (not illustrated in the drawing), and etching is performed, so that the fourth control gates 65 are formed. The conductive layer may be formed of polysilicon or metal (W, WSi or the like.). After that, a protective layer 77 is deposited over the entire surface of the stacked body, which results in the structure illustrated in FIGS. 37A to 37C.

Next, contacts to the control gates 15, 25, 55, and 65, the semiconductor layers 11, 21, 51, and 61 to serve as channel bodies, and the select gate lines 17, 27, 57, and 67 are formed. The contacts are formed by a process of boring corresponding interconnect holes like the first embodiment. General polysilicon electric contact and W electric contact are used as a contact material. In the present embodiment, the memory cell arrays are provided in a plurality of layers. Accordingly, it is considered that the control gates, the semiconductor layers (channel bodies), and the select gate lines are longer in length as they are provided in lower layers, and are shorter in length as they are provided in higher layers, and the contacts are made at the lower layers not shielded by the upper layers.

In the present embodiment, since the control gates of the memory cells of the lower layer and the channel bodies of the memory cells of the upper layer are collectively formed like the first embodiment, it is possible to reduce the number of process steps for manufacturing the memory cell array. Moreover, in the present embodiment, memory cell arrays corresponding to four layers are stacked, and the number of unit process steps per one memory cell layer is smaller than the first embodiment.

Other Embodiments

Although two layers of memory cell arrays are stacked in the first embodiment and four layers of memory cell arrays are stacked in the second embodiment, any number layers of memory cell arrays may be stacked by using the same method as these embodiments. For example, when a plurality of layers of memory cell arrays (four or more layers) is stacked, the structure illustrated in FIGS. 18A to 18C is manufactured like the first and second embodiments, then the steps which have been described referring to FIGS. 23A to 34C are repeated a plurality of times, and finally the steps which have been described referring to FIGS. 35A to 37C may be performed. According to this method, the number of manufacturing process steps per unit memory cell layer is reduced whenever the number of stacked memory cell array layers is incremented.

[Others]

While certain embodiments have been described, these embodiments have been presented by way of example only, and are not intended to limit the scope of the inventions. Indeed, the novel methods and systems described herein may be embodied in a variety of other forms: furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A nonvolatile semiconductor memory device comprising a plurality of memory cell array layers being stacked, each memory cell array layer including:
   a plurality of semiconductor layers, each extending in a first direction and being in parallel to each other;
   gate insulating layers formed on the semiconductor layers;
   a plurality of floating gates formed on the gate insulating layers and arranged in the first direction;
   inter-gate insulating layers adjacent to the floating gates; and
   a plurality of control gates that face the floating gates via the inter-gate insulating layers at both sides of the floating gates in the first direction and that extend in a second direction intersecting the first direction,
   in the cell array layers adjacent to each other in a stacking direction, the control gates of the cell array layer in a lower cell array layer and the control gates of the cell array layer in an upper cell array layer intersecting each other, the floating gates in the lower cell array layer and the semiconductor layers on the floating gates being aligned in position with each other.

2. The nonvolatile semiconductor memory according to claim 1, wherein
   a pitch in the second direction of the floating gates in the upper cell array layer is set to a product of a pitch in the second direction of the semiconductor layer in the lower cell array layer multiplied by an even number.

3. The nonvolatile semiconductor memory according to claim 1, wherein
   the floating gates in the upper cell array layer are formed at a position that does not overlap the semiconductor layer in the lower cell array layer in the stacking direction.

4. The nonvolatile semiconductor memory device according to claim 3, further comprising;
   bit line contacts extending in the stacking direction are connected to the semiconductor layers in the lower cell array layer,
   wherein the control gates in the upper cell array layer are formed to pass through between the bit line contacts.

5. The nonvolatile semiconductor memory device according to claim 1, wherein
   the semiconductor layers and the control gates respectively extend in different directions which are at 90° about each other between the upper cell array layer and the lower cell array layer.

6. The nonvolatile semiconductor memory device according to claim 1, wherein
   when writing data in a write target memory cell is performed, voltages of the control gates at both sides of the floating gate are raised to a predetermined writing voltage.

7. The nonvolatile semiconductor memory device according to claim 6, wherein
   when writing data in the write target memory cell, the voltage applied to the control gates are decreased gradually from the control gates at both sides of the write target memory cell to the control gates at sides of selected gate transistors.

8. A nonvolatile semiconductor memory device comprising a first cell array layer and a second cell array layer stacked on the first cell array layer,
   the first cell array layer being configured by arranging first memory cell units in a second direction intersecting a first direction, the first memory cell unit including a plurality of first memory cells connected in series to each other in the first direction and first select gate transistors connected to both ends of the connected first memory cells;
   the plurality of first memory cells having a configuration in which each memory cell includes a first semiconductor layer extending in the first direction, a first gate insulating layer formed on the first semiconductor layer, a plurality of first floating gates provided on the first gate insulating layer and arranged along the first direction, and first control gates formed on both sides in the first direction of the first floating gate via the inter-gate insulating films;
   the first control gates extending in the second direction and being commonly provided for the plurality of the first memory units arranged in the second direction;
   the second cell array layer being configured by arranging second memory cell units in the second direction, the second memory cell unit including a plurality of second memory cells connected in series to each other in the second direction and second select gate transistors connected to both ends of the connected second memory cells;
   the plurality of second memory cells having a configuration in which each memory cell includes a second semiconductor layer extending in the second direction, a second gate insulating layer formed on the second semiconductor layer, a plurality of second floating gates provided on the second gate insulating layer and arranged along the second direction, and second control gates formed on both sides in the second direction of the second floating gate via inter-gate insulating films;
   the second control gates extending in the first direction, and being commonly provided for the plurality of the second memory units arranged in the first direction; and the first floating gate and the second semiconductor layer being aligned in position with each other.

9. The nonvolatile semiconductor memory device according to claim 8, wherein
a pitch in the second direction of the second floating gates is set to a product of a pitch in the second direction of the first semiconductor layers multiplied by an even number.

10. The nonvolatile semiconductor memory device according to claim 8, wherein
the second floating gates are formed at a position that does not overlap the first semiconductor layer in the stacking direction.

11. The nonvolatile semiconductor memory device according to claim 10, further comprising;
bit line contacts extending in the stacking direction are connected to the first semiconductor layers,
wherein the second control gates are formed to pass through between the bit line contacts.

12. The nonvolatile semiconductor memory device according to claim 8, wherein
the semiconductor layers and the control gates respectively extend in different directions which are at 90° about each other between the first cell array layer and the second cell array layer.

13. The nonvolatile semiconductor memory device according to claim 8, wherein
when writing data in a write target memory cell is performed, voltages of the control gates at both sides of the floating gate are raised to a predetermined writing voltage.

14. The nonvolatile semiconductor memory device according to claim 13, wherein
when writing data in the write target memory cell, the voltage applied to the control gates are decreased gradually from the control gates at both sides of the write target memory cell to the control gates at sides of the first or second selected gate transistors.

15. A method for manufacturing a nonvolatile semiconductor memory device, comprising:
sequentially stacking a first semiconductor layer, a first gate insulating layer, a first floating gate layer, and a first inter-layer insulating layer;
dividing an obtained stacked body into a plurality of stacked bodies separated from each other in a second direction intersecting a first direction by a trench extending in the first direction;
filling the trench extending in the first direction with a second inter-layer insulating layer;
sequentially stacking a second semiconductor layer, a second gate insulating layer, a second floating gate layer, and a third inter-layer insulating layer on the stacked body and the second inter-layer insulating layer; and
dividing the obtained stacked body ranging from the third inter-layer insulating layer to an upper surface of the first gate insulating layer into a plurality of stacked bodies separated from each other in the first direction by a trench extending in the second direction.

16. The method for manufacturing a nonvolatile semiconductor memory device according to claim 15, further comprising:
after the dividing of the obtained stacked body ranging from the third inter-layer insulating layer to an upper surface of the first gate insulating layer into a plurality of stacked bodies separated from each other in the first direction by a trench extending in the second direction,
filling the trench which divides the obtained stacked body into the plurality of stacked bodies in the first direction with a first inter-gate insulating layer, a first control gate, and a fourth inter-layer insulating layer;
dividing, in the second direction, a portion of a stacked body obtained by the filling with the first inter-gate insulating layer, the first control gate, and the fourth inter-layer insulating layer, the portion ranging from the third inter-layer insulating layer to an upper surface of the second gate insulating layer, by a trench extending in the first direction; and
filling the trench extending in the first direction which divides, in the second direction, the portion ranging from the third inter-layer insulating layer to the upper surface of the second gate insulating layer, with a second inter-gate insulating layer, a second control gate, and a fifth inter-layer insulating layer.

17. The method for manufacturing a nonvolatile semiconductor memory device according to claim 16, further comprising:
after the filling the trench extending in the first direction with the second inter-layer insulating layer, and before the sequential stacking of the second semiconductor layer, the second gate insulating layer, the second floating gate layer, and the third inter-layer insulating layer on the stacked body and the second inter-layer insulating layer,
forming a first select gate line forming trench extending in the second direction in the stacked body and the second inter-layer insulating layer;
filling the first select gate line forming trench with a first select gate line;
after the filling of the trench which divides the stacked body into a plurality of stacked bodies in the first direction with the first inter-gate insulating layer, the first control gate, and the fourth inter-layer insulating layer, and before the dividing of the portion of the stacked body obtained as a result of the filling, the portion ranging from the third inter-layer insulating layer to the upper surface of the second gate insulating layer, into a plurality of stacked bodies in the second direction by a trench extending in the first direction,
forming a second select gate line forming trench extending in the first direction in the second gate insulating layer, the second floating gate layer, the third inter-layer insulating layer and the fourth inter-layer gate insulating layer; and
filling the second select gate line forming trench with a second select gate line.

18. The method for manufacturing a nonvolatile semiconductor memory device according to claim 16, wherein
a pitch in the second direction of the trench extending in the first direction and dividing a portion of a stacked body obtained as a result of the filling with the first inter-gate insulating layer, the first control gate, and the fourth inter-layer insulating layer, the portion ranging from the third inter-layer insulating layer to the upper surface in the second gate insulating layer, into a plurality of stacked bodies in the second direction is a product of a pitch in the second direction of the trench extending in the first direction and dividing the stacked body obtained as a result of the sequential stacking of the first semiconductor layer, the first gate insulating layer, the first floating gate layer, and the first the inter-layer insulating layer in the second direction multiplied by an even number.

19. The method for manufacturing a nonvolatile semiconductor memory device according to claim 16,
wherein when dividing a portion of a structure obtained by the filling with the first inter-gate insulating layer, the first control gate, and the fourth inter-layer insulating layer in the second direction into a plurality of structures, the portion ranging from the third inter-layer insulating layer to the upper surface of the second gate insulating layer, and when forming a trench extending in the first direction,
a portion of the second floating gate layer which overlaps the first semiconductor layer is removed.

20. The method for manufacturing a nonvolatile semiconductor memory device according to claim 16, further comprising:
after dividing layers ranging from the third inter-layer insulating layer to the upper surface of the second gate insulating layer in the second direction and filling a trench extending in the first direction with a second inter-gate insulating layer, a second control gate, and a fifth inter-layer insulating layer,
forming a sixth inter-layer insulating layer, a third semiconductor layer, a third gate insulating layer, and a third floating gate layer; and
when dividing the layers ranging from third inter-layer insulating layer to the upper surface of the second gate insulating layer in the second direction, dividing the sixth inter-layer insulating layer, the third semiconductor layer, the third gate insulating layer, and the third floating gate layer in the second direction.

* * * * *